US008341510B2

(12) United States Patent
Shinagawa et al.

(10) Patent No.: US 8,341,510 B2
(45) Date of Patent: Dec. 25, 2012

(54) CRC GENERATOR POLYNOMIAL SELECT METHOD, CRC CODING METHOD AND CRC CODING CIRCUIT

(75) Inventors: Masashi Shinagawa, Tokyo (JP); Keitarou Kondou, Tokyo (JP); Makoto Noda, Tokyo (JP)

(73) Assignee: Sony Corporation (JP)

( * ) Notice: Subject to any disclaimer, the term of this patent is extended or adjusted under 35 U.S.C. 154(b) by 1272 days.

(21) Appl. No.: 11/821,561

(22) Filed: Jun. 22, 2007

(65) Prior Publication Data

US 2008/0320370 A1 Dec. 25, 2008

(51) Int. Cl.
*H03M 13/09* (2006.01)

(52) U.S. Cl. ...................................... 714/807
(58) Field of Classification Search .................. 714/807
See application file for complete search history.

(56) References Cited

U.S. PATENT DOCUMENTS 6,085,349 A 7/2000 Stein
7,117,424 B2 * 10/2006 Sundaram et al. ............ 714/781

OTHER PUBLICATIONS

J. K. Wolf, R. D. Blakeney, "An exact evaluation of the probability of an undetected error for certain shortened binary CRC codes," Military Communications Conference, 1988, MILCOM 88, Conference record. '21st Century Military Communications—What's Possible?'. 1988 IEEE vol. 1, pp. 287 to 292, Oct. 1, 1988.
T. Baicheva, S. Dodunekov, P. Kazakov, "Undetected error probability performance of cyclic redundancy-check codes of 16-bit redundancy," IEEE Proc.—Commun., vol. 147. No. 5, pp. 253 to 256, Oct. 2000.
P. Kazakov, "Fast Calculation of the Number of Minimum-Weight Words of CRC Codes," IEEE Trans. Inform. Theory, vol. 47, No. 3, pp. 1190 to 1195, Mar. 2001.
P. Koopman, "Cyclic Redundancy Code (CRC) Polynomial Selection for Embedded Networks," The International Conference on Dependable System and Networks, DSN-2004.
G. Castagnoli, J. Ganz, P. Graber, "Optimum Cyclic Redundancy-Check Codes with 16-Bit Redundancy," IEEE Trans. Commun., vol. 38, No. 1, pp. 111 to 114, Jan. 1990.
G. Funk, "Determination of Best Shortened Codes," IEEE Trans. Commun., vol. 44, No. 1, pp. 1 to 6, Jan. 1996.
D. Chun, J. K. Wolf, "Special Hardware for Computing the Probability of Undetected Error for Certain CRC Codes and Test Results," IEEE Trans. Commun., vol. 42, No. 10, pp. 2769 to 2772, Oct. 1994.
G. Castagnoli, S. Brauer, M. Herrmann, "Optimum of Cyclic Redundancy-Check Codes with 24 and 32 Parity Bits," IEEE Trans. Commun., vol. 41, No. 6, pp. 883 to 892, Jun. 1993.

* cited by examiner

*Primary Examiner* — Stephen Baker
(74) *Attorney, Agent, or Firm* — Lerner, David, Littenberg, Krumholz & Mentlik, LLP

(57) ABSTRACT

Disclosed herein is a CRC generator polynomial select method for selecting a generator polynomial to be used in CRC coding and code checking, the method may include a first process of finding largest minimum Hamming distances $Max.d_{min}$ of codes generated from given polynomials; a second process of finding code lengths n for codes having the largest minimum Hamming distances $Max.d_{min}$ and determining a range $n_{min}$ (r, $Max.d_{min}$) $\leq n \leq n_{max}$ (r, $Max.d_{min}$); a third process of searching all polynomials for specific polynomials generating codes having $d_{min} = Max.d_{min}$ in the determined range; and a fourth process of selecting final generator polynomials having a smallest non-zero coefficient count and a lowest code undetected-error probability from the specific polynomials.

8 Claims, 11 Drawing Sheets

FIG. 8

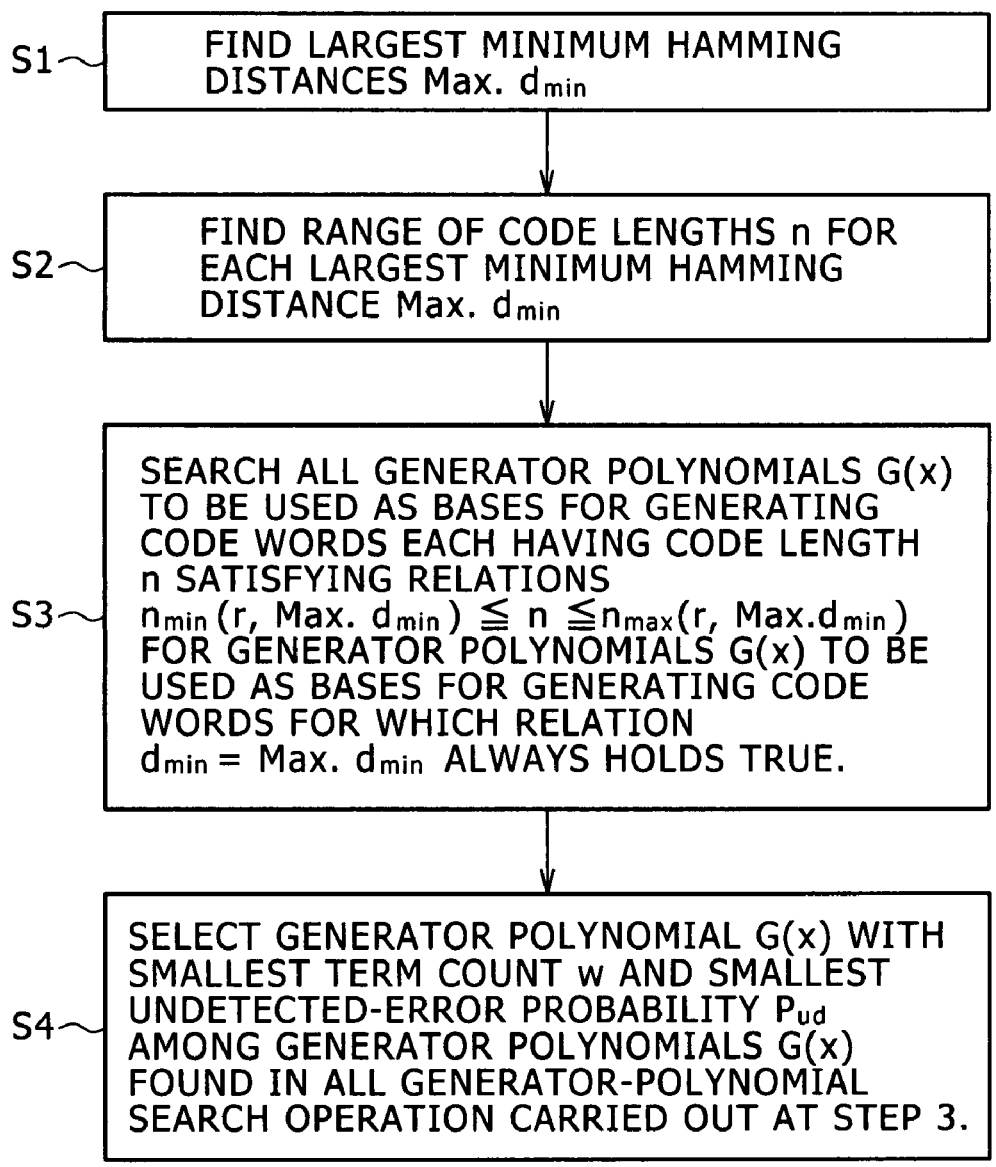

- S1: FIND LARGEST MINIMUM HAMMING DISTANCES Max. $d_{min}$

- S2: FIND RANGE OF CODE LENGTHS n FOR EACH LARGEST MINIMUM HAMMING DISTANCE Max. $d_{min}$

- S3: SEARCH ALL GENERATOR POLYNOMIALS G(x) TO BE USED AS BASES FOR GENERATING CODE WORDS EACH HAVING CODE LENGTH n SATISFYING RELATIONS $n_{min}(r, Max. d_{min}) \leq n \leq n_{max}(r, Max. d_{min})$ FOR GENERATOR POLYNOMIALS G(x) TO BE USED AS BASES FOR GENERATING CODE WORDS FOR WHICH RELATION $d_{min} = Max. d_{min}$ ALWAYS HOLDS TRUE.

- S4: SELECT GENERATOR POLYNOMIAL G(x) WITH SMALLEST TERM COUNT w AND SMALLEST UNDETECTED-ERROR PROBABILITY $P_{ud}$ AMONG GENERATOR POLYNOMIALS G(x) FOUND IN ALL GENERATOR-POLYNOMIAL SEARCH OPERATION CARRIED OUT AT STEP 3.

CRC GENERATOR POLYNOMIAL SELECT METHOD, CRC CODING METHOD AND CRC CODING CIRCUIT

CROSS-REFERENCE TO RELATED APPLICATIONS

The present invention contains subject matter related to Japanese Patent Application JP No. 2004-370796 filed in the Japanese Patent Office on Dec. 22, 2004, the entire content of which is incorporated herein by reference.

BACKGROUND OF THE INVENTION

1. Field of the Invention

The present invention relates to a method for coding data and an apparatus for implementing the method. More particularly, the present invention relates to a method for selecting a polynomial used as a base for generating a CRC (Cyclic Redundancy Check) code for detecting an error generated in a transmission line as an error of digital data obtained as a result of coding in a process of recording the digital data onto a magnetic-tape apparatus or an optical-disk apparatus or reproducing the digital data from such an apparatus or in a process to transmit the digital data by making use of a radio transmission system or another system as well as relates to a CRC code used for a CRC coding process making use of the selected polynomial and a CRC coding circuit for carrying out the CRC coding process.

2. Description of the Related Art

In a process to transmit information (or data) through a transmission line used in information-recording apparatus or communication apparatus, an error may be generated in the transmitted information in some cases.

As a method for producing a result of determination as to whether or not transmitted information includes an error, a technology referred to as the CRC (Cyclic Redundancy Check) is widely adopted.

In order to implement the CRC method, it is necessary to carry out a CRC coding process on information to be transmitted prior to transmission. The CRC coding process is explained by referring to FIG. 1 as follows.

FIG. 1 is a diagram showing an information-transmitting apparatus 1 and an information-receiving apparatus 3, which are connected to each other by a transmission line 2. In a CRC process carried out by the information-transmitting apparatus 1, CRC parity bits are added to each information word (or data) to generate CRC code bits, which are then subjected to an error-correction coding process based on typically the Reed-Solomon code. In an error-correction decoding process carried out by the information-receiving apparatus 3, on the other hand, an error included in bits obtained as a result of the error-correction coding process based on typically the Reed-Solomon code is detected and corrected.

To put it in detail, in the information-transmitting apparatus 1, a plurality of information words (data) to be transmitted are supplied to a CRC coder 11 consecutively as an input information string of successive objects of a CRC coding process to be carried out by the CRC coder 11. Details of the CRC coder 11 will be described later by referring to FIG. 2. The information words completing the CRC coding process are supplied to an error correction coder 12 for carrying out an error-correction coding process based on typically the Reed-Solomon code. The information words completing the error-correction coding process are supplied to a transmission line coder 13 for carrying out transmission-line coding process according to the transmission line 2. The information words completing the transmission-line coding process are supplied to the transmission line 2.

The information output by the information-transmitting apparatus 1 is transmitted to a code detector 31 employed in the information-receiving apparatus 3 through the transmission line 2. In the information-receiving apparatus 3, the code detector 31 detects the information and supplies the detected information to a transmission line decoder 32 for carrying out a transmission-line decoding process on the detected information as a counterpart process of the transmission-line coding process carried out by the transmission line coder 13. The transmission line decoder 32 supplies an information string obtained as a result of the transmission-line decoding process to an error correction coder 33 for carrying out an error-correction decoding process based on typically the Reed-Solomon code as a counterpart process of the error-correction coding process carried out by the error correction coder 12. The error correction coder 33 supplies information obtained as a result of the error-correction decoding process to a CRC detector 34 for carrying out a CRC process on the information as a counterpart process of the CRC coding process carried out by the CRC coder 11. The CRC detector 34 carries out the CRC process in order to produce a result of determination as to whether or not the error-correction decoding process has been performed correctly by the error correction coder 33 on the information string output by the transmission line decoder 32 (that is, whether or not the information string still includes an error). The CRC detector 34 outputs the result of the determination as a matching signal. Details of the CRC detector 34 will be explained later by referring to FIG. 5.

The matching signal output by the CRC detector 34 is typically used in a controller employed in a drive of an information-recording apparatus serving as the information-receiving apparatus 3 for improving reliability. The controller makes use of the matching signal to produce a result of determination as to whether or not a request for a retransmission is to be issued to the information-transmitting apparatus 1.

The CRC code is also used as partial information by a host processor of the code detector 31, used as header information and used in a transmitted packet in packet transmission. In addition, the CRC code can also be used as a disappearance flag in an error correction process.

Principle of Error Detection Using CRC Codes

The principle of error detection using CRC codes is explained as follows. An information word, which is digital data of k bits, is provided with r parity bits to form a code word of n (=k+r) bits. In order to derive the concept of a generator polynomial generator G(x) to be explained more below, an (k−1)th-order information polynomial M(x) for expressing the information word in a polynomial expression format is multiplied by $x^r$. For example, in the case of a binary information word of '1010101', which is a binary information word of k (=7) bits, the $6^{th}$-order information polynomial M(x) is $x^6+x^4+x^2+1$.

As described above, the information polynomial M(x) is multiplied by $x^r$ to give an expression $M(x) \cdot x^r$, which can be expressed by Eq. (1) given below. In Eq. (1), notation G(x) denotes the aforementioned rth-order generator polynomial, notation Q(x) denotes a quotient polynomial and notation R(x) denotes a (r−1)th-order remainder polynomial. If the expression $M(x) \cdot x^r$ is divided by the generator polynomial G(x), the quotient polynomial Q(x) and the remainder polynomial R(x) are resulted in. Eq. (2) is an equation obtained by rearranging Eq. (1) as an equation expressing the product $Q(x) \cdot G(x)$, which is equal to the difference $M(x) \cdot x^r - R(x)$. In Eq. (2), notation W(x) denotes an (n−1)th-order transmitted code polynomial expressing the product Q(x)·G(x), which is equal to the difference M(x)·x^r−R(x).

[Equation 1]

$$M(x) \cdot x^r = Q(x) \cdot G(x) + R(x) \quad (1)$$

[Equation 2]

$$W(x) = M(x) \cdot x^r - R(x) \quad (2)$$

Since Eq. (2) obtained as a result of rearranging Eq. (1) indicates that the polynomial W(x) is equal to the product Q(x)·G(x), the transmitted code polynomial W(x) can be divided by the generator polynomial G(x) without leaving a remainder.

From a standpoint based on the above equations, let us assume for example that the information-transmitting apparatus 1 shown in FIG. 1 transmits the transmitted code polynomial W(x) to the information-receiving apparatus 3 through the transmission line 2 and the information-receiving apparatus 3 receives the transmitted code polynomial W(x) as a received code polynomial Y(x). In this case, the CRC detector 34 employed in the information-receiving apparatus 3 examines the received code polynomial Y(x) in order to produce a result of determination as to whether or not the received code polynomial Y(x) can be divided by the generator polynomial G(x) without leaving a remainder.

If the result of the determination indicates that the received code polynomial Y(x) can be divided by the generator polynomial G(x) without leaving a remainder, the received code polynomial Y(x) is determined to be a polynomial matching the transmitted code polynomial W(x). Thus, it is possible to infer that no error has been generated in the information word transmitted through the transmission line 2. If the result of the determination indicates that the received code polynomial Y(x) may not be divided by the generator polynomial G(x) without leaving a remainder, on the other hand, the received code polynomial Y(x) is determined to be a polynomial other than the transmitted code polynomial W(x). Thus, it is possible to determine (or infer) that an error has been generated in the information word transmitted through the transmission line 2.

Since the CRC code is a cyclic code, for a given generator polynomial G(x), the configuration of a circuit for generating the CRC code can be implemented with ease as a configuration employing shift registers and exclusive-or gates. In the case of the information communication system shown in FIG. 1, for example, the circuit for generating the CRC code is the CRC coder 11 employed in the information-transmitting apparatus 1.

Typical CRC Generator

A generator polynomial G(x) widely used in the CRC processing is $G(x)=x^{16}+x^{12}+x^5+1$ or $G(x)=x^{16}+x^{15}+x^2+1$. The former generator polynomial G(x) is a generator polynomial based on the CRC-CCITT standard for the 16-bit CRC (or the CRC with a parity-bit count of 16). On the other hand, the latter generator polynomial G(x) is a generator polynomial based on the CRC-ANSI standard.

Let us assume that r representing the number of parity bits and also representing the order of the generator polynomial G(x) is 3 and assume the rth ($3^{rd}$)-order generator polynomial $G(x)=x^3+x+1$. In this case, a typical configuration of the CRC coder 11 employed in the information-transmitting apparatus 1 as shown in FIG. 1 is shown in FIG. 2. The CRC coder 11 also referred to as a CRC coding circuit is explained by referring to FIG. 2 as follows.

FIG. 2 is a diagram showing a typical configuration of the CRC coder 11 for generating a transmitted code polynomial W(x) from an information polynomial M(x). As shown in the figure, the CRC coder 11 employs a CRC parity bit generator 110, a first selector 111, a second selector 112 and a bit count counter 113.

The CRC parity bit generator 110 is a unit for generating r parity bits for a string of k information bits and outputting the parity bits to the first selector 111. A method adopted by the CRC parity bit generator 110 as a method for generating the r parity bits will be explained later by referring to FIGS. 3 and 4.

The second selector 112 has a 0 input terminal for receiving the string of k information bits and a 1 input terminal for receiving a string of r parity bits originally generated by the CRC parity bit generator 110 from the first selector 111. While the string of k information bits is being supplied to the 0 input terminal as evidenced by a state control signal S1 generated by the bit count counter 113, the second selector 112 outputs the input string of k information bits as it is to the error correction coder 12. As all the string of k information bits has been output from the second selector 112 to the error correction coder 12 also as evidenced by a change of the state control signal S1, the second selector 112 outputs the string of r parity bits received from the first selector 111 through the 1 input terminal to the error correction coder 12. As described above, the second selector 112 employed in the CRC coder 11 outputs the string of k information bits and the string of r parity bits received from the first selector 111 as a string immediately following the string of k information bits to the error correction coder 12. As described above, the first selector 111 receives the string of r parity bits directly from the CRC parity bit generator 110. That is to say, the second selector 112 outputs a string of (k+r) bits including the string of k information bits and the string of r parity bits to the error correction coder 12.

Next, the CRC parity bit generator 110 and the first selector 111 are described as follows. FIG. 3 is a diagram showing a typical circuit of the CRC parity bit generator 110 designed on the assumption that the generator polynomial G(x) is expressed by the equation $G(x)=x^3+x+1$. As shown in the figure, the CRC parity bit generator 110 has a circuit configuration employing a first shift register R00, a first EXOR (exclusive or) gate EXOR1, a second shift register R01, a third shift register R02 and a second exclusive-or gate EXOR2, which are connected to each other to form a closed loop. In the circuit configuration, the output of the second exclusive-or gate EXOR2 is supplied to one of the input terminals of the first exclusive-or gate EXOR1.

On the other hand, FIG. 4 is a diagram showing a typical circuit of the CRC parity bit generator 110 designed on the assumption that the generator polynomial G(x) is expressed by the equation $G(x)=x^4+x^3+x^2+x+1$. As shown in the figure, the CRC parity bit generator 110 has a circuit configuration employing a first shift register R00, a first EXOR(exclusive or) circuit EXOR1, a second shift register R01, a second exclusive-or gate EXOR2, a third shift register R02, a third exclusive-or gate EXOR3, a fourth shift register R03 and a fourth exclusive-or gate EXOR4, which are connected to each other to form a closed loop. In the circuit configuration, the output of the fourth exclusive-or gate EXOR4 is supplied to one of the input terminals employed by each of the first exclusive-or gate EXOR1, the second exclusive-or gate EXOR2 and the third exclusive-or gate EXOR3.

As shown in FIGS. 3 and 4, the CRC parity bit generator 110 is designed on the basis of the generator polynomial G(x). In other words, as is understood by referring to FIGS. 3 and 4, for a given G(x), the CRC parity bit generator 110 is configured as a closed loop of shift registers and exclusive-or gates wherein the output of the exclusive-or gate provided at the last stage is supplied to one of the input terminals employed by each of the exclusive-or gates provided at the preceding stages. In the case of the CRC parity bit generator 110 shown in FIG. 3, the second exclusive-or gate EXOR2 is the exclusive-or gate provided at the last stage whereas the first exclusive-or gate EXOR1 is the exclusive-or gate provided at the preceding stage. In the case of the CRC parity bit generator 110 shown in FIG. 4, on the other hand, the fourth exclusive-or gate EXOR4 is the exclusive-or gate provided at the last stage whereas the first exclusive-or gate EXOR1, the second exclusive-or gate EXOR2 and the third exclusive-or gate EXOR3 are the exclusive-or gates provided at the preceding stages.

Next, the operation of the CRC parity bit generator 110 shown in FIG. 3 is described. Since the operation of the CRC parity bit generator 110 shown in FIG. 4 is basically the same as the operation of the CRC parity bit generator 110 shown in FIG. 3, description of the operation of the CRC parity bit generator 110 shown in FIG. 4 is omitted.

In the CRC parity bit generator 110 shown in FIG. 3, an information bit string expressed by the information polynomial $M(x)$ is supplied to the second exclusive-or gate EXOR2 provided on the high-order side of the third shift register R02 at a rate of a bit per time unit. For example, a bit of the information bit string is supplied to the second exclusive-or gate EXOR2 for every clock pulse driving the shift registers R00 to R02. The information bit string is supplied to the second exclusive-or gate EXOR2 sequentially one bit after another, starting with the highest-order bit. Thus, a bit string expressed by a polynomial $M(x) \cdot x^r$, which is a product obtained as a result of multiplying the information polynomial $M(x)$ by $x^r$ in advance, is generated in the CRC parity bit generator 110.

The initial values of the first to third shift registers R00, R01 and R02 are each a zero. At a point of time the operation to supply the $0^{th}$-order bit of the information bit string to the CRC parity bit generator 110 is completed, the first to third shift registers R00, R01 and R02 contain the coefficients of the terms composing the remainder polynomial $R(x)$. Let us assume that the remainder polynomial $R(x)$ is expressed as $a \cdot x^2 + b \cdot x + c$. In this case, the first to third shift registers R02, R01 and R00 contain the values of a, b and c respectively.

Thus, at a point of time the operation to supply the $0^{th}$-order bit of the information bit string to the CRC parity bit generator 110 is completed, an enable signal E0 generated by a control circuit not shown in FIG. 2 is put in a disabled (inactive) state to hold the coefficients of the terms composing the remainder polynomial $R(x)$ in the first to third shift registers R00, R01 and R02 and output the coefficients to the first selector 111 as parity bits $R00_{out}$, $R01_{out}$ and $R02_{out}$ respectively.

As shown in FIG. 2, the first selector 111 has three input terminals 00, 01 and 10 receiving the aforementioned parity bits $R00_{out}$, $R01_{out}$ and $R02_{out}$ respectively output by the shift registers R00, R01 and R02 respectively employed in the CRC parity bit generator 110 having the circuit configuration shown in FIG. 3. The first selector 111 selects the parity bits $R00_{out}$, $R01_{out}$ and $R02_{out}$, which have been received at the input terminals 00, 01 and 10 respectively from the shift registers R00, R01 and R02 respectively, sequentially one bit after another in accordance with a first select signal S0 generated by a control circuit not shown in FIG. 2, and sequentially outputs the selected parity bit to the 1 input terminal of the second selector 112.

As described earlier, while the string of k information bits is being supplied to the 0 input terminal of the second selector 112 as evidenced by a second select signal S1 (or the state control signal S1 mentioned before) generated by the bit count counter 113, the second selector 112 outputs the input string of k information bits as it is to the error correction coder 12. In other words, during a period indicated by the 3-bit contents of the bit count counter 113 controlled by a control circuit not shown in FIG. 2 as a period for inputting the string of k information bits at the 0 input terminal, the second selector 112 selects the input string of k information bits and outputs the input string of k information bits as it is to the error correction coder 12. On the other hand, with a timing indicated by the second select signal S1 as a timing of completions of an operation to supply the input string of k information bits to the CRC parity bit generator 110 and an operation to generate all the r parity bits for the input string of k information bits in the CRC parity bit generator 110, the second selector 112 selects the string of r parity bits received at the 1 input terminal from the first selector 111 and outputs the selected string of r parity bits as it is to the error correction coder 12. As described above, the r parity bits are bits generated by the CRC parity bit generator 110 for the input string of k information bits.

As is obvious from the above description, a string of code bits output by the second selector 112 employed in the CRC coder 11 shown in FIG. 2 to the error correction coder 12 includes the input string of k information bits and the string of r parity bits following the string of information bits. Thus, the string of code bits has a length of n (=k+r) bits.

The process carried out by the CRC coder 11 employed in the information-transmitting apparatus 1 shown in FIG. 1 to add a string of parity bits to a string of information bits as described above is referred to as a CRC coding process. A string of code bits obtained as a result of the CRC coding process is supplied to the error correction coder 12 for carrying out an error-correction coding process based on typically the Reed-Solomon code on the string of code bits. Information obtained as a result of the error-correction coding process is supplied to the transmission line coder 13 for carrying out a transmission-line coding process according to the transmission line 2 on the information and outputting a signal obtained as a result of the transmission-line coding process to the transmission line 2.

The signal is transmitted to the information-receiving apparatus 3 through the transmission line 2. The code detector 31 employed in the information-receiving apparatus 3 receives the signal and detects information from the signal. The code detector 31 then supplies the detected information to the transmission line decoder 32 for carrying out a transmission-line decoding process on the information and outputting an information string obtained as a result of the transmission-line decoding process to the error correction coder 33 for carrying out an error correction process on the information string. Information obtained as a result of the error correction process is supplied to the CRC detector 34 for producing a result of determination as to whether or not the information obtained as a result of the error correction process still includes an error.

FIG. 5 is a diagram showing a typical configuration of the CRC detector 34 for producing a result of determination as to whether or not the received code polynomial $Y(x)$ includes an error. As shown in the figure, the CRC detector 34 employs a parity inspector 341 and a comparator 342.

As described before, the CRC detector 34 is a unit for producing a result of determination as to whether or not the received code polynomial $Y(x)$ can be divided by the generator polynomial $G(x)$ without leaving a remainder. If the result of the determination indicates that the received code polynomial $Y(x)$ can be divided by the generator polynomial $G(x)$ without leaving a remainder, the received code polynomial Y(x) is determined to be a polynomial matching the transmitted code polynomial W(x), that is, no error is determined to have been generated in the transmission of the information word through the transmission line 2. If the result of the determination indicates that the received code polynomial Y(x) may not be divided by the generator polynomial G(x) without leaving a remainder, on the other hand, the received code polynomial Y(x) is determined to be a polynomial not matching the transmitted code polynomial W(x), that is, an error is determined to have been generated in the transmission of the information word through the transmission line 2.

To put it in detail, the parity inspector 341 is a circuit for dividing the received code polynomial Y(x) by the generator polynomial G(x) whereas the comparator 342 is a circuit for producing a result of determination as to whether or not a remainder is left as a result of dividing the received code polynomial Y(x) by the generator polynomial G(x).

FIG. 6 is a diagram showing a typical configuration of the parity inspector 341.

In the system shown in FIG. 1, the CRC detector 34 is the counterpart unit of the CRC detector 34. Thus, the parity inspector 341 shown in FIG. 6 as a circuit employed in the CRC detector 34 is the counterpart circuit of the CRC parity bit generator 110 shown in FIG. 3 as a circuit employed in the CRC coder 11. Therefore, if the circuit shown in FIG. 4 is used as the CRC parity bit generator 110, the parity inspector 341 is designed as the counterpart circuit of the CRC parity bit generator 110 shown in FIG. 4. The following description explains a parity inspector 341 designed as the counterpart circuit of the CRC parity bit generator 110 shown in FIG. 3.

The parity inspector 341 shown in FIG. 6 has a circuit configuration employing a first exclusive-or gate EXOR11, a first shift register R10, a second exclusive-or gate EXOR12, a second shift register R11 and a third shift register R12, which are connected to each other to form a closed loop. In the circuit configuration, the output of the third shift register R12 is supplied to one of the input terminals employed in each of the first and second exclusive-or gates EXOR11 and EXOR12.

In the parity inspector 341 shown in FIG. 6, a received information bit string expressed by the received code polynomial Y(x) is supplied to the first exclusive-or gate EXOR11 provided on the right side of the first shift register R10 at a rate of a bit per time unit. For example, a bit of the received information bit string is supplied to the first exclusive-or gate EXOR11 for every clock pulse driving the shift registers R10 to R12. The information bit string is supplied to the first exclusive-or gate EXOR11 sequentially one bit after another, starting with the highest-order bit.

At a point of time the operation to supply the $0^{th}$-order bit of the received information bit string to the parity inspector 341 is completed, the coefficients of the terms composing the remainder polynomial R(x) are held in the first to third shift registers R10, R11 and R12 and the coefficients are output to the comparator 342 as coefficients $R10_{out}$, $R11_{out}$ and $R12^{out}$ respectively. Let us assume that the remainder polynomial R(x) is expressed as $a \cdot x^2 + b \cdot x + c$. In this case, the first to third shift registers R12, R11 and R10 contain the values of a, b and c respectively. The initial values of the first to third shift registers R10, R11 and R12 are each a zero.

As shown in FIG. 5, the parity inspector 341 outputs coefficients generated by the first to third shift registers R10, R11 and R12 employed in the parity inspector 341 as shown in FIG. 6 as the coefficients $R10_{out}$, $R11_{out}$ and $R12_{out}$ of the remainder polynomial R(x) to the comparator 342.

The comparator 342 examines (or checks) the coefficients $R10_{out}$, $R11_{out}$ and $R12_{out}$ in order to produce a result of determination as to whether or not all the coefficients $R10_{out}$, $R11_{out}$ and $R12_{out}$ are zeros, that is, whether or not the remainder polynomial R(x) is a zero. The comparator 342 generates a 1-bit matching signal revealing the result of the determination. That is to say, if the result of the determination indicates that all the coefficients $R10_{out}$, $R11_{out}$ and $R12_{out}$ are zeros, the received code polynomial Y(x) is determined to be a polynomial matching the transmitted code polynomial W(x) and no error is determined to have been generated in the transmission of the information word through the transmission line 2. In this case, the comparator 342 sets the generated 1-bit matching signal typically at the logic value of 1. If the result of the determination indicates that any of the coefficients $R10_{out}$, $R11_{out}$ and $R12_{out}$ is not a zero, the received code polynomial Y(x) is determined to be a polynomial not matching the transmitted code polynomial W(x), that is, an error is determined to have been generated in the transmission of the information word through the transmission line 2. In this case, the comparator 342 sets the generated 1-bit matching signal typically at the logic value of 0.

In general, the CRC error detection performance of detecting an error in a code is evaluated in terms of random-error detection performance and burst-error detection performance as well as a code undetected-error probability $P_{ud}$. The random-error detection performance, the burst-error detection performance and the undetected-error probability $P_{ud}$ are determined by the generator polynomial G(x) and the code length n.

The aforementioned undetected-error probability $P_{ud}$ of a code transmitted through a transmission line is a probability that a received word of the code undesirably changes to a code word other than the transmitted word of the code due to an error generated on the transmission line. The code word other than the transmitted word is a code word including information bits other than transmitted information bits and additional CRC parity bits computed for the other information bits. Since the received word of the code undesirably has changed to another code word, a CRC process carried out on the other code word will result in a division remainder of 0. That is to say, there is a case in which the received code word is determined to include no error in spite of the fact that the received code word includes an error.

Let us assume for example that, in equations given below, notation A denotes a weight distribution, notation B denotes a weight distribution of a dual code and notation ε denotes a state-transition probability representing a probability of a channel bit error in a binary symmetric channel. The weight distributions A and B as well as the channel bit error probability ε can be found from the order r representing the number of parity bits, the code length n and the generator polynomial G(x). In this case, as disclosed in J. K. Wolf, R. D. Blakeney, "An exact evaluation of the probability of an undetected error for certain shortened binary CRC codes," Military Communications Conference, 1988, MILCOM 88, Conference record. '$21^{st}$ Century Military Communications—What's Possible?'. 1988 IEEE vol. 1, pp. 287 to 292, Oct. 1, 1988 (hereinafter referred to as Non-Patent Document 1), the code undetected-error probability $P_{ud}$ can be found from the following equations:

[Equation 3]

$$P_{ud} = \sum_{i=1}^{n} A_i \varepsilon^i (1-\varepsilon)^{n-i} \quad (3)$$

[Equation 4]

$$P_{ud} = 2^{-r} \sum_{i=0}^{n} B_i (1-2\varepsilon)^i - (1-\varepsilon)^n \quad (4)$$

The random-error detection performance of the CRC error detection performance is a capability of detecting all of ($d_{min}$-1) or fewer random errors where notation $d_{min}$ denotes the minimum Hamming distance between codes. However, the CRC error detection performance is also capable of detecting an error other than random errors.

The burst-error detection performance of the CRC error detection performance is a capability of detecting all of r or fewer successive burst errors where notation r denotes the order of the generator polynomial G(x) or the number of parity bits. In many cases, however, the CRC error detection performance is also capable of detecting more successive burst errors than r representing the order of the generator polynomial G(x) or representing the number of parity bits.

T. Baicheva, S. Dodunekov, P. Kazakov, "Undetected error probability performance of cyclic redundancy-check codes of 16-bit redundancy," IEEE Proc.—Commun., vol. 147. no. 5, pp. 253 to 256, October 2000 (hereinafter referred to as Non-Patent Document 2), P. Kazakov, "Fast Calculation of the Number of Minimum-Weight Words of CRC Codes," IEEE Trans. Inform. Theory, vol. 47, no. 3, pp. 1190 to 1195, March 2001 (hereinafter referred to as Non-Patent Document 3), P. Koopman, "Cyclic Redundancy Code (CRC) Polynomial Selection for Embedded Networks," The International Conference on Dependable System and Networks, DSN-2004 (hereinafter referred to as Non-Patent Document 4), G. Castagnoli, J. Ganz, P. Graber, "Optimum Cyclic Redundancy-Check Codes with 16-Bit Redundancy," IEEE Trans. Commun., vol. 38, no. 1, pp. 111 to 114, January 1990 (hereinafter referred to as Non-Patent Document 5), G. Funk, "Determination of Best Shortened Codes," IEEE Trans. Commun., vol. 44, no. 1, pp. 1 to 6, January 1996 (hereinafter referred to as Non-Patent Document 6), D. Chun, J. K. Wolf, "Special Hardware for Computing the Probability of Undetected Error for Certain CRC Codes and Test Results," IEEE Trans. Commun., vol. 42, no. 10, pp. 2769 to 2772, October 1994 (hereinafter referred to as Non-Patent Document 7), and G. Castagnoli, S. Brauer, M. Herrmann, "Optimum of Cyclic Redundancy-Check Codes with 24 and 32 Parity Bits," IEEE Trans. Commun., vol. 41, no. 6, pp. 883 to 892, June 1993 (hereinafter referred to as Non-Patent Document 8) are a variety of reports each describing a generator polynomial for minimizing the code undetected-error probability $P_{ud}$. A variety of such generator polynomials are each proposed as a polynomial designed in accordance with a given order r of the polynomial (or in accordance with the parity-bit count r representing the number of parity bits) and a given length of the code.

In particular, Non-Patent Documents 2 and 3 are each a report proposing generator polynomials each used for minimizing the code undetected-error probability $P_{ud}$ for different code lengths n in the case of 16-bit CRC processing or CRC processing based on a parity-bit count of 16.

Non-Patent Documents 5 and 8 each confirm a property indicating that, as the code length n changes, the code undetected-error probability $P_{ud}$ extremely increases when the code length is raised from a value smaller than a specific value to a value greater than the specific value on both sides of which the code minimum Hamming distance $d_{min}$ has different values.

FIG. 7 is a diagram showing a graph representing a typical characteristic of the minimum (lower limit) undetected-error probability $P_{ud}$ of 8-bit CRC processing or CRC processing based on a parity-bit count of 8. In the diagram of FIG. 7, the horizontal axis represents the code length n expressed in terms of bits whereas the vertical axis represents the code undetected-error probability $P_{ud}$. The curve shown in the figure is referred to as an n–$P_{ud}$ characteristic.

J. M. Stein, "METHOD FOR SELECTING CYCLIC REDUNDANCY CHECK POLYNOMIALS FOR LINEAR CODED SYSTEMS," U.S. Pat. No. 6,085,349, Qualcomm Incorporated, Filed Aug. 27, 1997 (hereinafter referred to as Patent Document 1) discloses an invention relating to a method for selecting a CRC generator polynomial. In accordance with the invention disclosed in Patent Document 1, for a given generator-polynomial order r, a generator polynomial is selected on the basis of a distance spectrum computed for all generator polynomials having the order r. This distance spectrum is a table showing the number of code words at their minimum Hamming distances. From this table, generator polynomials having largest minimum Hamming distances are selected and, finally, a generator polynomial minimizing the code undetected-error probability $P_{ud}$ is chosen.

SUMMARY OF THE INVENTION

As described above, the CRC error detection performance (evaluated in terms of the random-error detection performance and the burst-error detection performance as well as a code undetected-error probability) may be determined by the code length of the generator polynomial.

For all code lengths, there may be neither generator polynomial for which the code undetected-error probability becomes a minimum (or a lower limit) nor generator polynomial for which the minimum Hamming distance between codes becomes a maximum. Instead, the generator polynomial for which the code undetected-error probability becomes a minimum (or a lower limit) and the generator polynomial for which the minimum Hamming distance between codes becomes a maximum may vary from code length to code length.

That is to say, in the case of generator polynomials such as the generator polynomials conforming to the widely used CRC-CCITT standard and the widely used CRC-ANSI standard as well as the generator polynomials disclosed in Non-Patent Documents 4 to 8, the range of code lengths, for which the code undetected-error probability becomes a minimum (or a lower limit) and the minimum Hamming distance between codes becomes a maximum, is limited.

By the way, there are also polynomials exhibiting better performance for smaller code lengths. An example of such polynomials is a polynomial so designed that the code undetected-error probability becomes a minimum (or a lower limit) if the code length increases to a value of several thousands of bits or even a greater value as is the case with the code length of communication data. Other examples are a polynomial for data with a CRC applied to header information thereof and a polynomial for data with a CRC used in an operation to record the data onto a recording medium. However, these polynomials are not proposed in most of the references described above.

Non-Patent Documents 2 and 3 propose a generator polynomial, for which the code undetected-error probability becomes a minimum, for every code length. That is to say, if different code lengths are used, different generator polynomials has to be used for the different code lengths.

In accordance with Patent Document 1, for every code length, a generator polynomial for which the minimum Hamming distance between codes becomes a maximum is selected. However, this method raises a problem of an increased circuit size.

In actual systems, a variety of code lengths and a variety of parity bit counts are used. However, a CRC code optimum for all the code lengths and all the parity bit counts has not been identified clearly. CRC codes known at the present time only may not be said to be necessarily sufficient for obtaining a minimum code undetected-error probability in the actual systems.

Thus, for a given code length and a given parity bit count, it is desirable to find a generator polynomial for which the code undetected-error probability becomes a minimum whereas the minimum Hamming distance between codes becomes a maximum and which can be used in as wide a range of code lengths as possible.

In addition, it may be desirable to provide a CRC coding method which minimizes the scales of circuits implementing the CRC coder 11 employed in the information-transmitting apparatus 1 shown in FIG. 1 and the CRC detector 34 employed in the information-receiving apparatus 3 shown in the same figure to as small sizes as possible.

Addressing the problems described above, inventors of the present invention have innovated a CRC generator polynomial select method for selecting a generator polynomial for which the code undetected-error probability may become a minimum whereas the minimum Hamming distance between codes may become a maximum and which can be used in as wide a range of code lengths as possible.

In addition, the inventors have also innovated a method which may extract a generator polynomial selected by the CRC generator polynomial select method and apply the extracted polynomial to circuits such as a CRC coder and a CRC detector.

On top of that, the inventors have provided concrete configurations of the circuits such as a CRC coder and a CRC detector.

In accordance with the present invention, there is provided a CRC generator polynomial select method for selecting a generator polynomial to be used in CRC coding processing and/or CRC processing of inspecting a CRC processing result. The CRC generator polynomial select method may includes a first process of finding largest minimum Hamming distances Max.$d_{min}$ each defined as a largest value of a minimum Hamming distance $d_{min}$ between codes with a code length n equal to the sum of the length k of an information word and the length r of a parity-bit string added to the information word;

a second process of finding code lengths n for each of the largest minimum Hamming distances Max.$d_{min}$ and determining a range expressed by relations $n_{min}$ (r, Max.$d_{min}$) $\leq n \leq n_{max}$ (r, Max.$d_{min}$) as the range of the code lengths where notations $n_{min}$ (r, Max.$d_{min}$) and $n_{max}$ (r, Max.$d_{min}$) respectively denote the upper and lower limits of the range;

a third process of searching all generator polynomials G(x) for specific generator polynomials G(x) each satisfying a condition of $d_{min}$=Max.$d_{min}$, which demands that the minimum Hamming distance $d_{min}$ between codes be typically equal to the largest minimum Hamming distance Max.$d_{min}$, in the range expressed by the relations $n_{min}$ (r, Max.$d_{min}$) $\leq n \leq n_{max}$ (r, Max.$d_{min}$) as a range of the code lengths n found for the largest minimum Hamming distance Max.$d_{min}$; and a fourth process of selecting final generator polynomials G(x) each having a smallest term count w and a lowest code undetected-error probability $P_{ud}$ from the specific generator polynomials G(x).

It may be desirable to provide the CRC generator polynomial select method with a configuration in which the third and fourth processes include:

a process of searching all generator polynomials G(x) for specific generator polynomials G(x) each satisfying a condition of p$\geq n_{max}$ (r, Max.$d_{min}$) requiring that the period p of the specific generator polynomials be at least equal to the upper limit $n_{max}$ (r, Max.$d_{min}$) and satisfying a condition of $d_{min}$=Max.$d_{min}$, which demands that the minimum Hamming distance $d_{min}$ between codes be typically equal to the largest minimum Hamming distance Max.$d_{min}$, for code lengths n in the range ($n_{max}$-r) to $n_{max}$;

a process of selecting particular generator polynomials G(x) each having a smallest term count w from the specific generator polynomials G(x); and a process of selecting final generator polynomials G(x) each having a lowest code undetected-error probability $P_{ud}$ from the particular generator polynomials G(x).

It may be desirable to provide the CRC generator polynomial select method with a configuration by which, in the processes of searching and selecting generator polynomials G (x), for Max.$d_{min}$=2 indicating that the largest minimum Hamming distance Max.$d_{min}$ is equal to 2, final generator polynomials G(x) each having a smallest term count w and a lowest code undetected-error probability $P_{ud}$ are selected from primitive generator polynomials G(x) each defined as a generator polynomial G(x) that has a maximum period p expressed by ($2^r-1$).

By adoption of the CRC generator polynomial select methods, any of the following generator polynomials G(x) may be selected:

(1): for r=3 and n=4, a generator polynomial expressed by G(x)=$x^3+x^2+x+1$;

(2): for r=6 and n=7, a generator polynomial expressed by G(x)=$x^6+x^5+x^4+x^3+x^2+x+1$;

(3): for r=6 and n=8, a generator polynomial expressed by G(x)=$x^6+x^4+x^2+x+1$ (or a generator polynomial, the expression of the reciprocal polynomial of which is $x^6+x^5+x^4+x^2+1$);

(4): for r=6 and n=8, a generator polynomial expressed by G(x)=$x^6+x^4+x^3+x+1$ (or a generator polynomial, the expression of the reciprocal polynomial of which is $x^6+x^5+x^3+x^2+1$);

(5): for r=6 and n=8, a generator polynomial expressed by G(x)=$x^6+x^5+x^3+x+1$;

(6): for r=8 and n=9, a generator polynomial expressed by G(x)=$x^8+x^7+x^6+x^5+x^4+x^3+x^2+x+1$;

(7): for r=10 and n=11, a generator polynomial expressed by G(x)=$x^{10}+x^9+x^8+x^7+x^6+x^5+x^4+x^3+x^2+x+1$;

(8): for r=10 and n=12, a generator polynomial expressed by G(x)=$x^{10}+x^8+x^6+x^4+x^3+x^2+x+1$ (or a generator polynomial, the expression of the reciprocal polynomial of which is $x^{10}+x^9+x^8+x^7+x^6+x^4+x^2+1$);

(9): for r=12 and n=13, a generator polynomial expressed by G(x)=$x^{12}+x^{11}+x^{10}+x^9+x^8+x^7+x^6+x^5+x^4+x^3+x^2+x+1$;

(10): for r=12 and n=14, a generator polynomial expressed by G(x)=$x^{12}+x^{10}+x^8+x^6+x^4+x^3+x^2+x+1$ (or a generator polynomial, the expression of the reciprocal polynomial of which is $x^{12}+x^{11}+x^{10}+x^9+x^8+x^6+x^4+x^2+1$);

(11): for r=14 and n=15, a generator polynomial expressed by $G(x)=x^{14}+x^{13}+x^{12}+x^{11}+x^{10}+x^9+x^8+x^7+x^6+x^5+x^4+x^3+x^2+x+1$;

(12): for r=14 and n=16, a generator polynomial expressed by $G(x)=x^{14}+x^{12}+x^{10}+x^9+x^7+x^5+x^4+x^3+x+1$ (or a generator polynomial, the expression of the reciprocal polynomial of which is $x^{14}+x^{13}+x^{11}+x^{10}+x^9+x^7+x^5+x^4+x^2+1$);

(13): for r=14 and n=17, a generator polynomial expressed by $G(x)=x^{14}+x^{11}+x^8+x^6+x^5+x^3+x^2+x+1$ (or a generator polynomial, the expression of the reciprocal polynomial of which is $x^{14}+x^{13}+x^{12}+x^{11}+x^9+x^8+x^6+x^3+1$);

(14): for r=16 and n=17, a generator polynomial expressed by $G(x)=x^{16}+x^{15}+x^{14}+x^{13}+x^{12}+x^{11}+x^{10}+x^9+x^8+x^7+x^6+x^5+x^4+x^3+x^2+x+1$;

(15): for r=16 and n=18, a generator polynomial expressed by $G(x)=x^{16}+x^{14}+x^{12}+x^{10}+x^8+x^6+x^5+x^4+x^3+x^2+x+1$ (or a generator polynomial, the expression of the reciprocal polynomial of which is $x^{16}+x^{15}+x^{14}+x^{13}+x^{12}+x^{11}+x^{10}+x^8+x^6+x^4+x^2+1$); and (16): for r=16 and n=22, a generator polynomial expressed by $G(x)=x^{16}+x^{13}+x^8+x^7+x^6+x^4+x^2+x+1$ (or a generator polynomial, the expression of the reciprocal polynomial of which is $x^{16}+x^{15}+x^{14}+x^{12}+x^{10}+x^9+x^8+x^3+1$).

By adoption of the CRC generator polynomial select methods described above, the following generator polynomials G(x) may be selected:

(1): for r=4 and n in a range of $6 \leq n \leq 7$, a generator polynomial expressed by $G(x)=x^4+x^2+x+1$ (or a generator polynomial, the expression of the reciprocal polynomial of which is $x^4+x^3+x^2+1$);

(2): for r=6 and n in a range of $9 \leq n \leq 31$, a generator polynomial expressed by $G(x)=x^6+x^2+x+1$ (or a generator polynomial, the expression of the reciprocal polynomial of which is $x^6+x^5+x^4+1$);

(3): for r=8 and n in a range of $10 \leq n \leq 12$, a generator polynomial expressed by $G(x)=x^8+x^5+x^4+x^3+x+1$ (or a generator polynomial, the expression of the reciprocal polynomial of which is $x^8+x^7+x^5+x^4+x^3+1$);

(4): for r=8 and n in a range of $10 \leq n \leq 12$, a generator polynomial expressed by $G(x)=x^8+x^6+x^3+x^2+x+1$ (or a generator polynomial, the expression of the reciprocal polynomial of which is $x^8+x^7+x^6+x^5+x^2+1$);

(5): for r=8 and n in a range of $18 \leq n \leq 127$, a generator polynomial expressed by $G(x)=x^8+x^4+x+1$ (or a generator polynomial, the expression of the reciprocal polynomial of which is $x^8+x^7+x^4+1$);

(6): for r=8 and n in a range of $n \geq 128$, a generator polynomial expressed by $G(x)=x^8+x^5+x^3+x^2+1$ (or a generator polynomial, the expression of the reciprocal polynomial of which is $x^8+x^6+x^5+x^3+1$);

(7): for r=10 and n in a range of $23 \leq n \leq 31$, a generator polynomial expressed by $G(x)=x^{10}+x^9+x^3+x+1$ (or a generator polynomial, the expression of the reciprocal polynomial of which is $x^{10}+x^9+x^7+x+1$);

(8): for r=10 and n in a range of $32 \leq n \leq 511$, a generator polynomial expressed by $G(x)=x^{10}+x^5+x^2+1$ (or a generator polynomial, the expression of the reciprocal polynomial of which is $x^{10}+x^8+x^5+1$);

(9): for r=10 and n in a range of $n \geq 512$, a generator polynomial expressed by $G(x)=x^{10}+x^3+1$ (or a generator polynomial, the expression of the reciprocal polynomial of which is $x^{10}+x^7+1$);

(10): for r=12 and n in a range of $24 \leq n \leq 39$, a generator polynomial expressed by $G(x)=x^{12}+x^{11}+x^7+x^3+1$ (or a generator polynomial, the expression of the reciprocal polynomial of which is $x^{12}+x^{11}+x^9+x^5+x+1$);

(11): for r=12 and n in a range of $40 \leq n \leq 65$, a generator polynomial expressed by $G(x)=x^{12}+x^{10}+x^7+x^6+x^5+x^2+1$;

(12): for r=12 and n in a range of $66 \leq n \leq 2,047$, a generator polynomial expressed by $G(x)=x^{12}+x^7+x^2+1$ (or a generator polynomial, the expression of the reciprocal polynomial of which is $x^{12}+x^{10}+x^5+1$);

(13): for r=12 and n in a range of $n \geq 2,048$, a generator polynomial expressed by $G(x)=x^{12}+x^7+x^6+x^4+1$ (or a generator polynomial, the expression of the reciprocal polynomial of which is $x^{12}+x^8+x^6+x^5+1$);

(14): for r=14 and n in a range of $28 \leq n \leq 71$, a generator polynomial expressed by $G(x)=x^{14}+x^{10}+x^9+x^6+x^2+1$ (or a generator polynomial, the expression of the reciprocal polynomial of which is $x^{14}+x^{12}+x^8+x^5+x^4+1$);

(15): for r=14 and n in a range of $72 \leq n \leq 127$, a generator polynomial expressed by $G(x)=x^{14}+x^{11}+x^5+x^3+1$ (or a generator polynomial, the expression of the reciprocal polynomial of which is $x^{14}+x^{11}+x^9+x^3+1$);

(16): for r=14 and n in a range of $128 \leq n \leq 8,191$, a generator polynomial expressed by $G(x)=x^{14}+x^5+x^2+1$ (or a generator polynomial, the expression of the reciprocal polynomial of which is $x^{14}+x^{12}+x^9+1$);

(17): for r=14 and n in a range of $n \geq 8,192$, a generator polynomial expressed by $G(x)=x^{14}+x^6+x^4+x+1$ (or a generator polynomial, the expression of the reciprocal polynomial of which is $x^{14}+x^{13}+x^{10}+x^8+1$);

(18): for r=16 and n in a range of $19 \leq n \leq 21$, a generator polynomial expressed by $G(x)=x^{16}+x^{13}+x^{12}+x^9+x^7+x^6+x^5+x^4+x^2+1$ (or a generator polynomial, the expression of the reciprocal polynomial of which is $x^{16}+x^{14}+x^{12}+x^{11}+x^{10}+x^9+x^7+x^4+x+1$);

(19): for r=16 and n in a range of $19 \leq n \leq 21$, a generator polynomial expressed by $G(x)=x^{16}+x^{13}+x^{12}+x^9+x^7+x^5+x^4+x^3+x^2+1$ (or a generator polynomial, the expression of the reciprocal polynomial of which is $x^{16}+x^{14}+x^{13}+x^{12}+x^{11}+x^9+x^7+x^4+x^3+1$);

(20): for r=16 and n in a range of $23 \leq n \leq 31$, a generator polynomial expressed by $G(x)=x^{16}+x^{13}+x^{11}+x^5+x^3+x^2+x+1$ (or a generator polynomial, the expression of the reciprocal polynomial of which is $x^{16}+x^{15}+x^{14}+x^{13}+x^{11}+x^5+x^3+1$);

(21): for r=16 and n in a range of $36 \leq n \leq 151$, a generator polynomial expressed by $G(x)=x^{16}+x^{15}+x^{13}+x^8+x^5+x^3+x+1$ (or a generator polynomial, the expression of the reciprocal polynomial of which is $x^{16}+x^{15}+x^{13}+x^{11}+x^8+x^3+x+1$);

(22): for r=16 and n in a range of $152 \leq n \leq 257$, a generator polynomial expressed by $G(x)=x^{16}+x^{15}+x^8+x+1$;

(23): for r=16 and n in a range of $258 \leq n \leq 32,767$, a generator polynomial expressed by $G(x)=x^{16}+x^{13}+x^2+1$ (or a generator polynomial, the expression of the reciprocal polynomial of which is $x^{16}+x^{14}+x^3+1$); and (24): for r=16 and n in a range of $n \geq 32,768$, a generator polynomial expressed by $G(x)=x^{16}+x^9+x^7+x^4+1$ (or a generator polynomial, the expression of the reciprocal polynomial of which is $x^{16}+x^{12}+x^9+x^7+1$).

In accordance with the present invention, there may be provided a CRC coding method adopted in a CRC coding process carried out on the basis of a generator polynomial G(x) selected by adoption of the CRC generator polynomial select method.

In accordance with the present invention, there is provided a CRC coding circuit which may have a configuration based on a generator polynomial G(x) selected in accordance with a CRC generator polynomial select methods as a configuration which may include shift registers and exclusive-or gates provided in accordance with coefficients of the generator polynomial G(x) and connected to the shift registers to form a closed loop in which the output of one of the exclusive-or gates, which is provided at the last stage, is supplied to the other exclusive-or gates provided in accordance with the coefficients of the generator polynomial G (x).

In accordance with the present invention, there may be provided a CRC coding method for carrying out a coding process on the basis of a generator polynomial G(x) having an order r and a period p in order to generate a CRC code with a code length n, wherein when the range of code length n in which the largest minimum Hamming distances Max.$d_{min}$ of CRC code determined by the code length n and the order r and the largest minimum Hamming distances max.$d_{min}$ of code under the order r are constant is expressed by relations $n_{min} \leq n \leq n_{max}$ where notations $n_{min}$ and $m_{max}$ respectively denote the upper and lower limits of the range, under the condition of the period p≧upper limit $n_{max}$, or the condition of the period $p=2^r-1$ and $n_{min} \leq n \leq n_{max}$, among the generator polynomial G(x) in which the minimum Hamming distance $d_{min}$ satisfies $d_{min}$=Max.$d_{min}$, the generator polynomial G(x) with a smallest term count and smallest code undetected-error probability in binary symmetric channel is used.

By adoption of a CRC generator polynomial select method for selecting a generator polynomial in accordance with the present invention, in comparison with the existing method for selecting a generator polynomial widely used in the past, for a desired number of parity bits and a desired code length, the code undetected-error probability may be reduced to a small value. In addition, since the minimum Hamming distance between codes has a maximum value, the random-error detection performance can be improved.

On top of that, for code lengths n in a range expressed by relations $n_{min}$ (r, Max.$d_{min}$)$\leq n \leq n_{max}$ (r, Max.$d_{min}$), the generator polynomial G(x) may provide codes satisfying the equation $d_{min}$=Max.$d_{min}$ indicating that the minimum Hamming distance $d_{min}$ between codes has the maximum value Max.$d_{min}$ and satisfying the equation $P_{ud} \approx$ Bound indicating that the code undetected-error probability $P_{ud}$ approaches a bound value Bound. Thus, even if the code length n varies, one generator polynomial G(x) can be used for keeping up with changes in code length n as long as the code length n stays in the range.

In addition, for code lengths n in a range of $n_{min}$ (r, Max.$d_{min}$)$\leq n \leq n_{max}$ (r, Max.$d_{min}$), a generator polynomial G(x) with the smallest term count w may be typically selected among generator polynomials G(x) each used as a base for generating a code word for which the code minimum Hamming distance $d_{min}$ has a maximum value. Thus, the CRC circuit can be implemented at a small scale.

On top of that, the order r also representing the number of parity bits may be found from a given code length n and a given code undetected-error probability $P_{ud}$ as an order r requisite to satisfy the code length n and the code undetected-error probability $P_{ud}$. Thus, by using a generator polynomial G(x) selected for the parity-bit count r and the code length n, a desired code undetected-error probability $P_{ud}$ may be obtained.

BRIEF DESCRIPTION OF THE DRAWINGS

FIG. 8 shows a flowchart representing an embodiment implementing a method for selecting a CRC code in accordance with the present invention;

DETAILED DESCRIPTION

CRC Code Select Method

Figure 7:
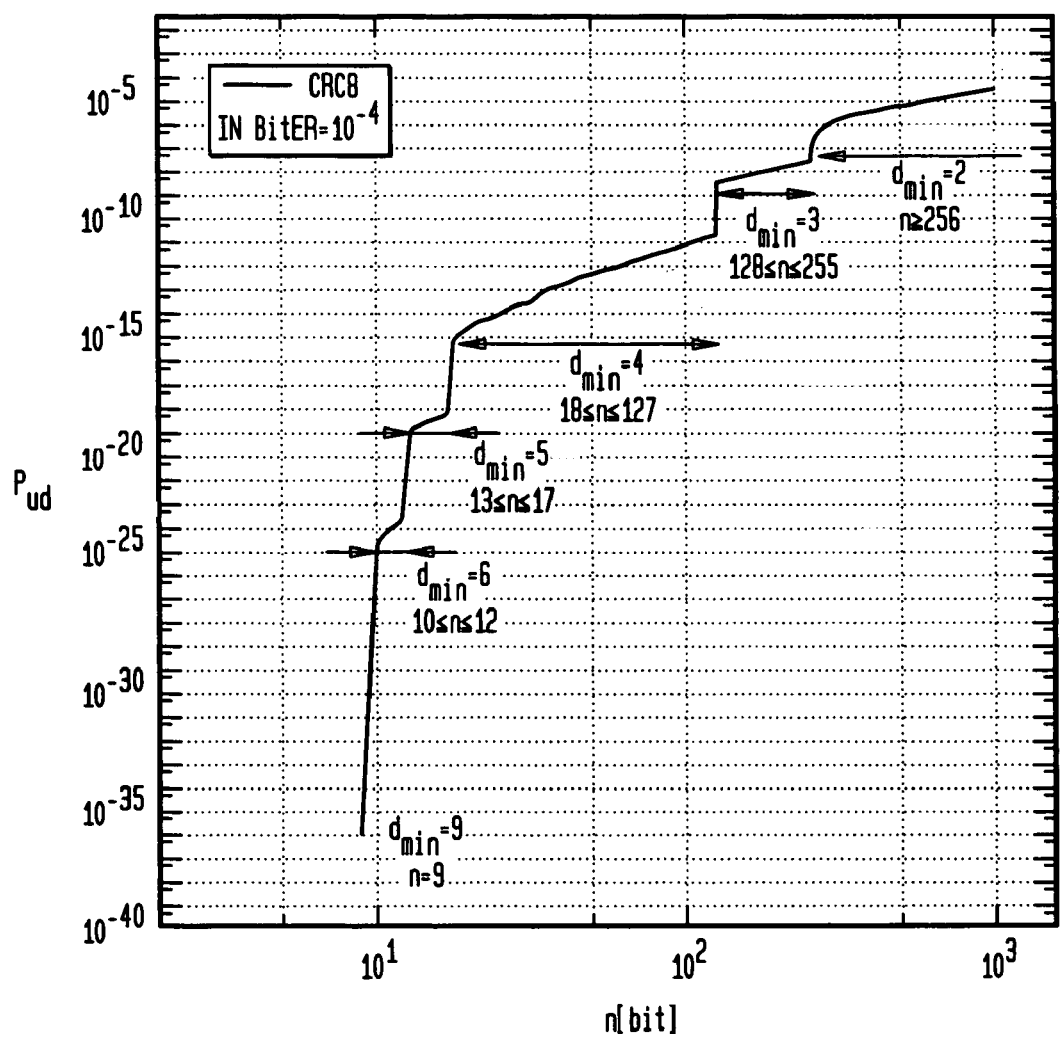
FIG. 7 is a diagram showing a graph referred to as an n-$P_{ud}$ characteristic representing a relation between changes of a code length n represented by the horizontal axis as the code length of codes with a varying code largest minimum Hamming distance Max.$d_{min}$ and changes of a code undetected-error probability $P_{ud}$ represented by the vertical axis for 8-bit CRC processing.

Inventors of the present invention paid attention to a curve shown in FIG. 7 as graph representing a property indicating that, as the code length n changes, the code undetected-error probability $P_{ud}$ extremely increases when the code length is raised from a value smaller than a specific value to a value greater than the specific value on both sides of which the code minimum Hamming distance din has different values. The curve drawn in FIG. 7 as the so-called n-$P_{ud}$ characteristic shows limits of the code undetected-error probability $P_{ud}$ for a variety of generator polynomials G(x) to be used as bases for generating codes with different code lengths n.

In the typical curve shown in FIG. 7 as a curve for 8-bit CRC processing or CRC processing based on a parity-bit count of 8, the specific value cited above is a code-length value on the boundary between a code length range of n=10 to 12 corresponding to a code minimum Hamming distance $d_{min}$ of 6 and a code length range of n=13 to 17 corresponding to a code minimum Hamming distance $d_{min}$ of 5, the boundary between a code length range of n=13 to 17 and a code length range of n=18 to 127 corresponding to a code minimum Hamming distance $d_{min}$ of 4 or the boundary between a code length range of n=18 to 127 and a code length range of n=128 to 255 corresponding to a code minimum Hamming distance $d_{min}$ of 3. As described above, when the code length n is raised from a value smaller than a specific value to a value greater than the specific value, the code undetected-error probability $P_{ud}$ extremely increases.

The specific value on the boundary between a code length range corresponding to a minimum Hamming distance $d_{min}$ between codes and another code length range corresponding to another minimum Hamming distance $d_{min}$ between codes varies in accordance with the generator polynomial G(x).

In addition, the code minimum Hamming distance $d_{min}$ associated with a range of code lengths n also varies in accordance with the generator polynomial G(x).

FIG. 8 shows a flowchart representing a CRC-code select method for selecting a CRC code in accordance with the present invention. On the basis of the descriptions given so far and by referring to the flowchart shown in FIG. 8, the following description explains a CRC-code select method innovated by the inventors of the invention as a method for selecting a CRC code in accordance with the present invention.

Step 1 of Finding Max.$d_{min}$

The larger the minimum Hamming distance $d_{min}$ between codes, the better the performance of detecting a random error and, hence, the lower the code undetected-error probability $P_{ud}$. Thus, since a large minimum Hamming distance $d_{min}$ between codes is desirable, first of all, the maximum value of each minimum Hamming distance din between codes for code lengths n of rth-order code words (or code words each including r parity bits) is found. Denoted by symbol Max.$d_{min}$, the maximum value of the minimum Hamming distance $d_{min}$ between codes is the largest minimum Hamming distance $d_{min}$ between codes.

Step 2 of Finding a Range of Code Lengths n for each Max.$d_{min}$

Then, code lengths n are found for each of the largest minimum Hamming distances Max.$d_{min}$. A range of code lengths n found for a constant largest minimum Hamming distance Max.$d_{min}$ is expressed by the following relations:

$$n_{min}(r,\text{Max}.d_{min}) \leq n \leq n_{max}(r,\text{Max}.d_{min})$$

In the above relations, symbol $n_{min}$ denotes the lower limit of the range of code lengths n associated with a fixed largest minimum Hamming distance Max.$d_{min}$. Symbol $n_{min}$ (r, Max.$d_{min}$) indicates that the lower limit $n_{min}$ of the range of code lengths n associated with a fixed largest minimum Hamming distance Max.$d_{min}$ is determined by the order r (that is, the parity-bit count r) and the largest minimum Hamming distance Max.$d_{min}$. By the same token, symbol $n_{max}$ denotes the upper limit of the range of code lengths n associated with a fixed largest minimum Hamming distance Max.$d_{min}$. Symbol $n_{max}$ (r, Max.$d_{min}$) indicates that the upper limit $n_{min}$ of the range of code lengths n associated with a fixed largest minimum Hamming distance Max.$d_{min}$ is also determined by the order r of the generator polynomial G(x) (that is, the parity-bit count r) and the largest minimum Hamming distance Max.$d_{min}$.

FIG. 7 is a diagram showing the n-$P_{ud}$ characteristic for 8-bit CRC processing or CRC processing based on a parity-bit count of 8. If the code length n exceeds the period p of the generator polynomial G(x) or the relation $n \geq 256$ holds true in the characteristic shown in FIG. 7, however, the minimum Hamming distance $d_{min}$ is typically equal to 2.

If the generator polynomial G(x) is a primitive polynomial, the generator polynomial G(x) has a maximum period p, which can be expressed by $(2^r-1)$. That is to say, the range of code lengths n associated with Max.$d_{min}$=2 is expressed by the relations $2^r \leq n \leq \infty$ without regard to the generator polynomial G(x). The lower limit $n_{min}$ (r, 2) of the range of code lengths n associated with Max.$d_{min}$=2 is $2^r$ whereas the lower limit $n_{max}$ (r, 2) of the range is $\infty$.

Step 3 of Searching all Generator Polynomials G(x) to be Used as Bases for Generating Code Words Each Having a Code Length N Satisfying the Relations $n_{min} \leq n \leq n_{max}$ for Generator Polynomials G(x) to be Used as Bases for Generating Code Words for which the Relation $d_{min}$=Max.$d_{min}$ Typically Holds True Then, since a generator polynomial G(x) usable in as wide a range of code lengths as possible is desirable, all generator polynomials G(x) to be used as bases for generating code words each having a code length n satisfying the relations $n_{min}$ (r, Max.$d_{min}$) $\leq n \leq n_{max}$ (r, Max.$d_{min}$) are searched for generator polynomials G(x) to be used as bases for generating code words for which the equation $d_{min}$=Max.$d_{min}$ holds true.

Step 4 of Selecting a Generator Polynomial G(x) with a Smallest Term Count w and a Smallest Code Undetected-Error Probability $P_{ud}$ Among Generator Polynomials G(x) Found in the all Generator-Polynomial Search Operation Carried Out at Step 3

Then, a generator polynomial G(x) with a smallest term count w and a smallest code undetected-error probability $P_{ud}$ is selected among generator polynomials G(x) found in the all generator-polynomial search operation carried out at Step 3

Figure 9:
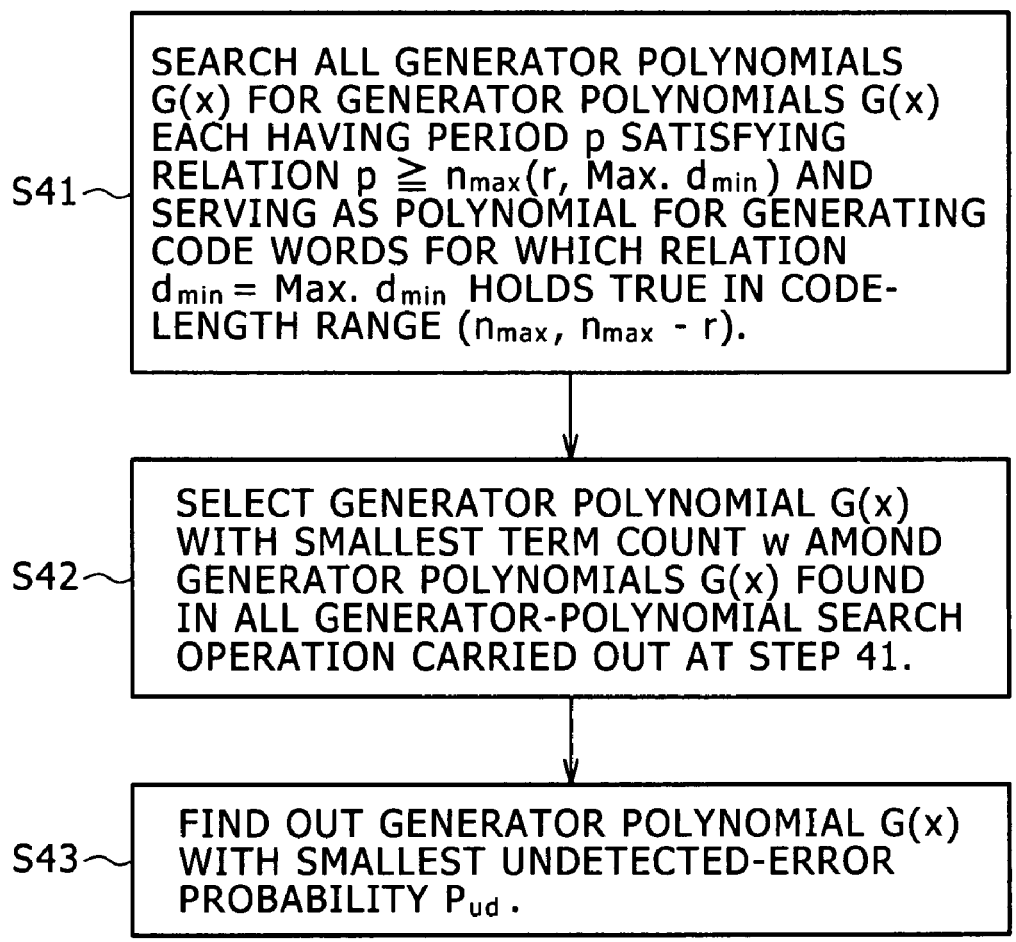
FIG. 9 shows a flowchart representing details of a portion of the flowchart shown in FIG. 8.

A method for searching all generator polynomials G(x) at Step 3 and a method for selecting a generator polynomial G(x) at Step 4 are explained by referring to a flowchart shown in FIG. 9 as follows.

Step 41 of searching all generator polynomials G(x) to be used as bases for generating code words each having a code length n satisfying the relations $n_{min} \leq n \leq n_{max}$ for generator polynomials G(x) to be used as bases for generating code words for which the relation $d_{min}$=Max.$d_{min}$ holds true in a code-length range of ($n_{max}$, $n_{max}$-r).

First of all, in order to search all generator polynomials G(x) to be used as bases for generating code words each having a code length n satisfying the relations $n_{min}$ (r, Max.$d_{min}$) $\leq n \leq n_{max}$ (r, Max.$d_{min}$) for generator polynomials G(x) to be used as bases for generating code words for which the equation $d_{min}$=Max.$d_{min}$ holds true, it is necessary to search all the generator polynomials G(x) for generator polynomials G(x) each having a period p satisfying the relation $p \geq n_{max}$ (r, Max.$d_{min}$) and serving as a polynomial for generating a code word for which the relation $d_{min}$=Max.$d_{min}$ holds true in a code-length range of ($n_{max}$, $n_{max}$-r). That is to say, all the generator polynomials G(x) need to be searched for generator polynomials G(x) each satisfying these conditions.

Step 42 of selecting a generator polynomial G(x) with a smallest term count w among generator polynomials G(x) found in the all generator-polynomial search operation carried out at Step 41

Then, a generator polynomial G(x) with a smallest term count w is selected among generator polynomials G(x) found in the all generator-polynomial search operation carried out at Step 41. Code words each generated from any one of generator polynomials G(x) each having a term count equal to w typically include a code word having a Hamming distance $d_H$ equal to w. Thus, if the minimum Hamming distance $d_{min}$ between codes generated from a generator polynomial is equal to the largest minimum Hamming distance Max.$d_{min}$, the relation $w \geq$ Max.$d_{min}$ typically holds true. In accordance with this property, generator polynomials G(x) satisfying the condition w<Max.$d_{min}$ can be eliminated from the generator polynomial G(x) found in the all generator-polynomial search operation carried out at Step 41.

Step 43 of finding out a generator polynomial G(x) with a smallest code undetected-error probability $P_{ud}$ Then, the polynomials G(x) found in the search process carried out at Step 42 are searched for generator polynomials G(x) to be used as bases for generating code words for which the undetected-error probability $P_{ud}$ computed in accordance with Eq. (4) becomes a minimum for code words each having a code length n satisfying the relations $n_{min}$ (r, Max.$d_{min}$) $\leq n \leq n_{max}$ (r, Max.$d_{min}$).

In the case of large code lengths n associated with Max.$d_{min}$=2, however, the range of code lengths n for Max.$d_{min}$=2 is expressed by the relations $2^r \leq n \leq \infty$ without regard to the generator polynomial. G(x) as described earlier. In this case, the lower limit $n_{min}$ (r, 2) of the range of code lengths n associated with Max.$d_{min}$=2 is $2^r$ whereas the lower limit $n_{max}$ (r, 2) of the range is $\infty$. Thus, with the procedure executed at Step 41, the generator polynomials G(x) may not be searched for.

In addition, if the relation $2^r \leq n$ holds true, all the generator polynomials G(x) result in code words for which the equations $d_{min}$=Max.$d_{min}$=2 holds true. Thus, if the equation $d_{min}$=2 holds true, by utilizing the property that, the larger the period p, the lower the code undetected-error probability $P_{ud}$, a generator polynomial G(x) having a smallest term count w and serving as a polynomial for generating a code word with a minimum undetected-error probability $P_{ud}$ is selected among generator polynomials G(x) each having a period p equal to a maximum value of ($2^r$–1). As described above, a generator polynomial G(x) having a period p equal to a maximum value of ($2^r$–1) is referred to as a primitive polynomial. That is to say, the selected generator polynomial G(x) matches a generator polynomial G(x) found as a generator polynomial G(x) for generating a code word satisfying the condition of Max.$d_{min}$=3. This is because, the equation $n_{max}$ (r, 3)=$2^r$–1 holds true.

Comparison of Other Generator Polynomials with Generator Polynomials According to the Embodiment The following description explains comparison of other generator polynomials with the generator polynomials G(x) selected in accordance with the method described above. Tables 1-A to 1-C are tables showing comparison of generator polynomials G(x) selected in accordance with the method according to the embodiment of the present invention with typical generator polynomials generally in use. The generator polynomials G(x) compared in the tables are polynomials used as bases for generating code words with code lengths including parity-bit counts r (also representing the order of the generator polynomial G(x)) of 3, 4, 6, 8, 10, 12, 14 and 16.

TABLE 1-A

| | | Max. | G (x) according to embodiment | | | | Other G (x) | | |
|---|---|---|---|---|---|---|---|---|---|
| r | n | $d_{min}$ | $d_{min}$ | G(x) | w | $P_{ud}$ | $d_{min}$ | G(x) | w | $P_{ud}$ |
| 3 | 4 | 4 | 4 | F | 4 | $1.0 \times 10^{-16}$ | 3 | B[4] | 3 | $1.0 \times 10^{-12}$ |
| | 5~7 | 3 | — | — | — — | | | | | $2.0 \times 10^{-12}$~$7.0 \times 10^{-12}$ |
| | $\geq 8$ | 2 | — | — | — — | | 2 | | | $1.0 \times 10^{-8}$~ |
| 4 | 5 | 5 | — | — | — — | | 3 | CCITT-4 | 3 | $1.0 \times 10^{-12}$ |
| | 6, 7 | 4 | 4 | 17 | 4 | $3.0 \times 10^{-16}$~$7.0 \times 10^{-16}$ | | | | $2.0 \times 10^{-12}$~$3.0 \times 10^{-12}$ |
| | 8~15 | 3 | — | — | — — | | | | | $4.0 \times 10^{-12}$~$3.5 \times 10^{-11}$ |
| | $\geq 16$ | 2 | — | — | — — | | 2 | | | $1.0 \times 10^{-8}$~ |
| 6 | 7 | 7 | 7 | 7F | 7 | $1.0 \times 10^{-28}$ | 3 | CRC-6 | 3 | $1.0 \times 10^{-12}$ |
| | 8 | 5 | 5 | 57, 5B, 6B | 5 | $2.0 \times 10^{-20}$ | | | | $2.0 \times 10^{-12}$ |
| | 9~31 | 4 | 4 | 47 | 4 | $5.0 \times 10^{-16}$~$1.1 \times 10^{-13}$ | | | | $3.0 \times 10^{-12}$~$7.4 \times 10^{-11}$ |
| | 32~63 | 3 | — | — | — — | | | | | $8.1 \times 10^{-11}$~$6.5 \times 10^{-10}$ |
| | $\geq 64$ | 2 | — | — | — — | | 2 | | | $1.1 \times 10^{-8}$~ |
| 8 | 9 | 9 | 9 | 1FF | 9 | $1.0 \times 10^{-16}$ | 6 (n = 9, | CRC-8 | 6 | $1.0 \times 10^{-24}$ |
| | 10~12 | 6 | 6 | 13B, 14F | 6 | $3.0 \times 10^{-24}$~$1.2 \times 10^{-23}$ | 10) | | | $2.0 \times 10^{-24}$ |
| | | | | | | | 4 (11 $\leq$ n $\leq$ 93) | | | $1.0 \times 10^{-16}$~$3.0 \times 10^{-16}$ |
| | 13~17 | 5 | — | — | — — | | | | | $5.0 \times 10^{-16}$~$1.6 \times 10^{-15}$ |
| | 18~127 | 4 | 4 | 113 | 4 | $3.1 \times 10^{15}$~$8.2 \times 10^{-12}$ | | | | $2.0 \times 10^{-15}$~$2.4 \times 10^{-12}$ |
| | | | | | | | 2 (n $\geq$ 94) | | | $9.9 \times 10^{-9}$~$3.4 \times 10^{-7}$ |
| | 128~255 | 3 | 3 | 12D | 5 | $1.3 \times 10^{-9}$~$1.1 \times 10^{-8}$ | | | | $3.5 \times 10^{-7}$~$2.3 \times 10^{-6}$ |
| | $\geq 256$ | 2 | 2 | 12D | 5 | $2.0 \times 10^{-8}$~ | | | | $2.3 \times 10^{-6}$~ |

TABLE 1-B

| | | Max. | G (x) according to embodiment | | | | Other G (x) | | |
|---|---|---|---|---|---|---|---|---|---|
| r | n | $d_{min}$ | $d_{min}$ | G(x) | w | $P_{ud}$ | $d_{min}$ | G(x) | w | $P_{ud}$ |
| 10 | 11 | 11 | 11 | 7FF | 11 | $1.0 \times 10^{-44}$ | 6 (n = 11, | CRC-10 | 6 | $1.0 \times 10^{-24}$ |
| | 12 | 8 | 8 | 55F | 8 | $3.0 \times 10^{-32}$ | 12, | | | $3.0 \times 10^{-24}$ |
| | 13~15 | 7 | — | — | — — | | 13) | | | $6.0 \times 10^{-24}$~$3.0 \times 10^{-16}$ |
| | 16~22 | 6 | — | — | — — | | 4 | | | $5.0 \times 10^{-16}$~$2.8 \times 10^{-15}$ |
| | 23~31 | 5 | 5 | 60B | 5 | $3.9 \times 10^{-19}$~$1.9 \times 10^{-18}$ | | | | $3.4 \times 10^{-15}$~$1.1 \times 10^{-14}$ |
| | 32~511 | 4 | 4 | 425 | 4 | $8.8 \times 10^{-15}$~$5.2 \times 10^{-10}$ | | | | $1.2 \times 10^{-14}$~$5.2 \times 10^{-10}$ |
| | 512~1023 | 3 | 3 | 409 | 3 | $2.1 \times 10^{-8}$~$1.6 \times 10^{-7}$ | 2 | | | $1.0 \times 10^{-8}$~$4.6 \times 10^{-6}$ |
| | $\geq 1024$ | 2 | 2 | 409 | 3 | $1.7 \times 10^{-7}$~ | | | | $4.7 \times 10^{-6}$~ |
| 12 | 13 | 13 | 13 | 1FFF | 13 | $1.0 \times 10^{-52}$ | 6 | CRC-12 | 6 | $1.0 \times 10^{-24}$ |
| | 14 | 9 | 9 | 155F | 9 | $2.0 \times 10^{-36}$ | 4 | | | $1.0 \times 10^{-17}$ |
| | 15~23 | 8 | — | — | — — | | | | | $2.0 \times 10^{-16}$~$1.5 \times 10^{-15}$ |
| | 24~39 | 6 | 6 | 188B | 6 | $6.4 \times 10^{-23}$~$1.8 \times 10^{-21}$ | | | | $1.9 \times 10^{-15}$~$1.5 \times 10^{-14}$ |
| | 40~65 | 5 | 5 | 14E5 | 7 | $1.7 \times 10^{-18}$~$2.2 \times 10^{-17}$ | | | | $1.6 \times 10^{-14}$~$7.2 \times 10^{-14}$ |
| | 66~2047 | 4 | 4 | 1085 | 4 | $4.6 \times 10^{-14}$~$2.9 \times 10^{-8}$ | | | | $7.5 \times 10^{-14}$~$2.9 \times 10^{-8}$ |
| | 2048~4095 | 3 | 3 | 10D1 | 5 | $3.0 \times 10^{-7}$~$2.1 \times 10^{-6}$ | 2 | | | $3.7 \times 10^{-8}$~$1.4 \times 10^{-5}$ |
| | $\geq 4096$ | 2 | 2 | 10D1 | 5 | $2.1 \times 10^{-6}$~ | | | | $1.4 \times 10^{-5}$~ |

TABLE 1-C

| r | n | Max. $d_{min}$ | G(x) according to embodiment $d_{min}$ | G(x) | w | $P_{ud}$ | Other G(x) $d_{min}$ | G(x) | w | $P_{ud}$ |
|---|---|---|---|---|---|---|---|---|---|---|
| 14 | 15 | 15 | 15 | 7FFF | 15 | $1.0 \times 10^{-60}$ | 4 | DARC-14 | 4 | $1.0 \times 10^{-16}$ |
|  | 16 | 10 | 10 | 56BB | 10 | $2.0 \times 10^{-40}$ |  |  |  | $2.0 \times 10^{-16}$ |
|  | 17 | 9 | 9 | 496F | 9 | $3.0 \times 10^{-36}$ |  |  |  | $3.0 \times 10^{-16}$ |
|  | 18~25 | 8 | — | — | — | — |  |  |  | $4.0 \times 10^{-16} \sim 1.1 \times 10^{-15}$ |
|  | 26, 27 | 7 | — | — | — | — |  |  |  | $1.2 \times 10^{-15}$-$1.3 \times 10^{-15}$ |
|  | 28~71 | 6 | 6 | 4645 | 6 | $4.6 \times 10^{-23} \sim 1.8 \times 10^{-20}$ |  |  |  | $1.4 \times 10^{-15} \sim 1.4 \times 10^{-14}$ |
|  | 72~127 | 5 | 5 | 4829 | 5 | $8.5 \times 10^{-18} \sim 1.6 \times 10^{-16}$ |  |  |  | $1.4 \times 10^{-14} \sim 1.2 \times 10^{-13}$ |
|  | 128~8191 | 4 | 4 | 4025 | 4 | $9.5 \times 10^{-14} \sim 1.0 \times 10^{-5}$ |  |  |  | $1.2 \times 10^{-13} \sim 1.0 \times 10^{-6}$ |
|  | 8192~16383 | 3 | 3 | 4053 | 5 | $3.1 \times 10^{-6} \sim 1.4 \times 10^{-5}$ | 2 |  |  | $1.0 \times 10^{-6} \sim 2.4 \times 10^{-5}$ |
|  | ≧16384 | 2 | 2 | 4053 | 5 | $1.4 \times 10^{-5} \sim$ |  |  |  | $2.4 \times 10^{-5} \sim$ |
| 16 | 17 | 17 | 17 | 1FFFF | 17 | $1.0 \times 10^{-68}$ | 4 | CCITT-16 | 4 | $1.0 \times 10^{-17}$ |
|  | 18 | 12 | 12 | 1557F | 12 | $3.0 \times 10^{-48}$ |  |  |  | $2.0 \times 10^{-16}$ |
|  | 19~21 | 10 | 10 | 132F5, 132BD | 10 | $4.0 \times 10^{-40} \sim 2.0 \times 10^{-39}$ |  |  |  | $3.0 \times 10^{-16} \sim 5.0 \times 10^{-16}$ |
|  | 22 | 9 | 9 | 121D7 | 9 | $1.2 \times 10^{-35}$ |  |  |  | $6.0 \times 10^{-16}$ |
|  | 23~31 | 8 | 8 | 1282F | 8 | $1.9 \times 10^{-31} \sim 2.8 \times 10^{-30}$ |  |  |  | $7.0 \times 10^{-16} \sim 1.5 \times 10^{-15}$ |
|  | 32~35 | 7 | — | — | — | — |  |  |  | $1.6 \times 10^{-15} \sim 2.2 \times 10^{-15}$ |
|  | 36~151 | 6 | 6 | 1A12B | 8 | $4.5 \times 10^{-23} \sim 4.6 \times 10^{-19}$ |  |  |  | $2.4 \times 10^{-15} \sim 9.7 \times 10^{-14}$ |
|  | 152~257 | 5 | 5 | 18103 | 5 | $1.0 \times 10^{-16} \sim 1.4 \times 10^{-15}$ |  |  |  | $9.9 \times 10^{-14} \sim 5.3 \times 10^{-13}$ |
|  | 258~32767 | 4 | 4 | 12005 | 4 | $5.5 \times 10^{-13} \sim 7.9 \times 10^{-6}$ |  |  |  | $5.3 \times 10^{-13} \sim 7.9 \times 10^{-6}$ |
|  | 32768~65535 | 3 | 3 | 10291 | 5 | $9.7 \times 10^{-6} \sim 1.5 \times 10^{-5}$ | 2 |  |  | $7.9 \times 10^{-6} \sim 1.5 \times 10^{-5}$ |
|  | ≧65536 | 2 | 2 | 10291 | 5 | $1.5 \times 10^{-5} \sim$ |  |  |  | $1.5 \times 10^{-5} \sim$ |

The first column from the left side in each of Tables 1-A, 1-B and 1-C shows the parity-bit count. The second column from the left in each of the tables shows the range of code lengths n each having the minimum Hamming distance $Max.d_{min}$ between codes equal to the largest minimum Hamming distance $Max.d_{min}$. The third column from the left in each of the tables shows the largest minimum Hamming distance $Max.d_{min}$ between codes.

In each of Tables 1-A, 1-B and 1-C, the generator polynomial G(x) is represented by a hexadecimal expression. An example of the hexadecimal expression is F, which is expressed by a binary format expression of 1111. In order to find the expression of a generator polynomial G(x), the hexadecimal expression of the generator polynomial G(x) is converted into a binary format expression, from which the expression of the generator polynomial G(x) is derived. Let us assume for example that a generator polynomial G(x) is represented by a hexadecimal expression of 12D. In this case, the hexadecimal expression of 12D is converted into a binary format expression of 100101101, from which the expression $G(x) = x^8 + x^5 + x^3 + x^2 + 1$ is derived.

The reciprocal polynomial of a generator polynomial G(x) is a polynomial obtained from the generator polynomial G(x) by swapping high-order coefficients of the generator polynomial G(x) with low-order coefficients of the same a generator polynomial G(x). The reciprocal polynomial obtained in this way has the same property as the generator polynomial G(x).

The fourth to seventh columns from the left side in each of Tables 1-A, 1-B and 1-C respectively show the minimum Hamming distance $d_{min}$ between codes generated on the basis of a generator polynomial G(x) according to the embodiment of the present invention, the generator polynomial G(x), the term count w representing the number of terms composing the generator polynomial G(x) and the code undetected-error probability $P_{ud}$.

On the other hand, the eighth to eleventh columns from the left side in each of Tables 1-A, 1-B and 1-C respectively show the minimum Hamming distance $d_{min}$ between other code words generated on the basis of another generator polynomial G(x), the other generator polynomial G(x), the term count w representing the number of terms composing the other generator polynomial G(x) and the undetected-error probability $P_{ud}$ of the other code words.

Hyphen notation - used in Tables 1-A, 1-B and 1-C denotes data for a generator polynomial, which has been proposed in other documents but can also be selected in the search process described above. For data represented by hyphen notation -, the reader is suggested to refer to the references listed before or Table 2 given as follows.

TABLE 2

| r | n | Max. $d_{min}$ | $d_{min}$ | G(x) | w | Values in documents $P_{ud}$ |
|---|---|---|---|---|---|---|
| 3 | 5~7 | 3 | 3 | B, [4] | 3 | $2.0 \times 10^{-12} \sim 7.0 \times 10^{-12}$ |
|  | ≧8 | 2 | 2 | B, [4] | 3 | $1.0 \times 10^{-8} \sim$ |
| 4 | 5 | 5 | 5 | CRC-4, [4] | 5 | $1.0 \times 10^{-20}$ |
|  | 8~15 | 3 | 3 | CCITT-4, [4] | 3 | $4.0 \times 10^{-12}$-$3.5 \times 10^{-11}$ |
|  | ≧16 | 2 | 2 | CCITT-4, [4] | 3 | $1.0 \times 10^{-8} \sim$ |
| 6 | 32~63 | 3 | 3 | CRC-6, [4] | 3 | $8.1 \times 10^{-11} \sim 6.5 \times 10^{-10}$ |
|  | ≧64 | 2 | 2 | CRC-6, [4] | 3 | $1.1 \times 10^{-8} \sim$ |
| 8 | 13~17 | 5 | 5 | DARC-8, [4] | 5 | $9.0 \times 10^{-20} \sim 3.4 \times 10^{-10}$ |
| 10 | 13~15 | 7 | 7 | 537, [6] | 7 | $4.0 \times 10^{-28} \sim 1.5 \times 10^{-27}$ |
|  | 16~22 | 6 | 6 | 51D, [6] | 6 | $2.1 \times 10^{-23} \sim 1.9 \times 10^{-22}$ |
| 12 | 15~23 | 8 | 8 | 149F, [6] | 8 | $6.0 \times 10^{-32} \sim 5.1 \times 10^{-30}$ |
| 14 | 18~25 | 8 | 8 | 46E3, [6] | 8 | $9.0 \times 10^{-32} \sim 2.2 \times 10^{-30}$ |
|  | 26, 27 | 7 | 7 | 5153, [6] | 7 | $6.6 \times 10^{-27} \sim 8.3 \times 10^{-27}$ |
| 16 | 32~35 | 7 | 7 | 12D17, [4] | 9 | $4.4 \times 10^{-29} \sim 9.8 \times 10^{-27}$ |

In the range of $n_{min}(r, Max.d_{min}) \leq n \leq n_{max}(r, Max.d_{min})$, a generator polynomial G(x) selected in accordance with the embodiment of the present invention is a generator polynomial that satisfies the equation $d_{min} = Max.d_{min}$, has a minimum term count w and results in a code word with a lowest code undetected-error probability $P_{ud}$.

Figure 10:
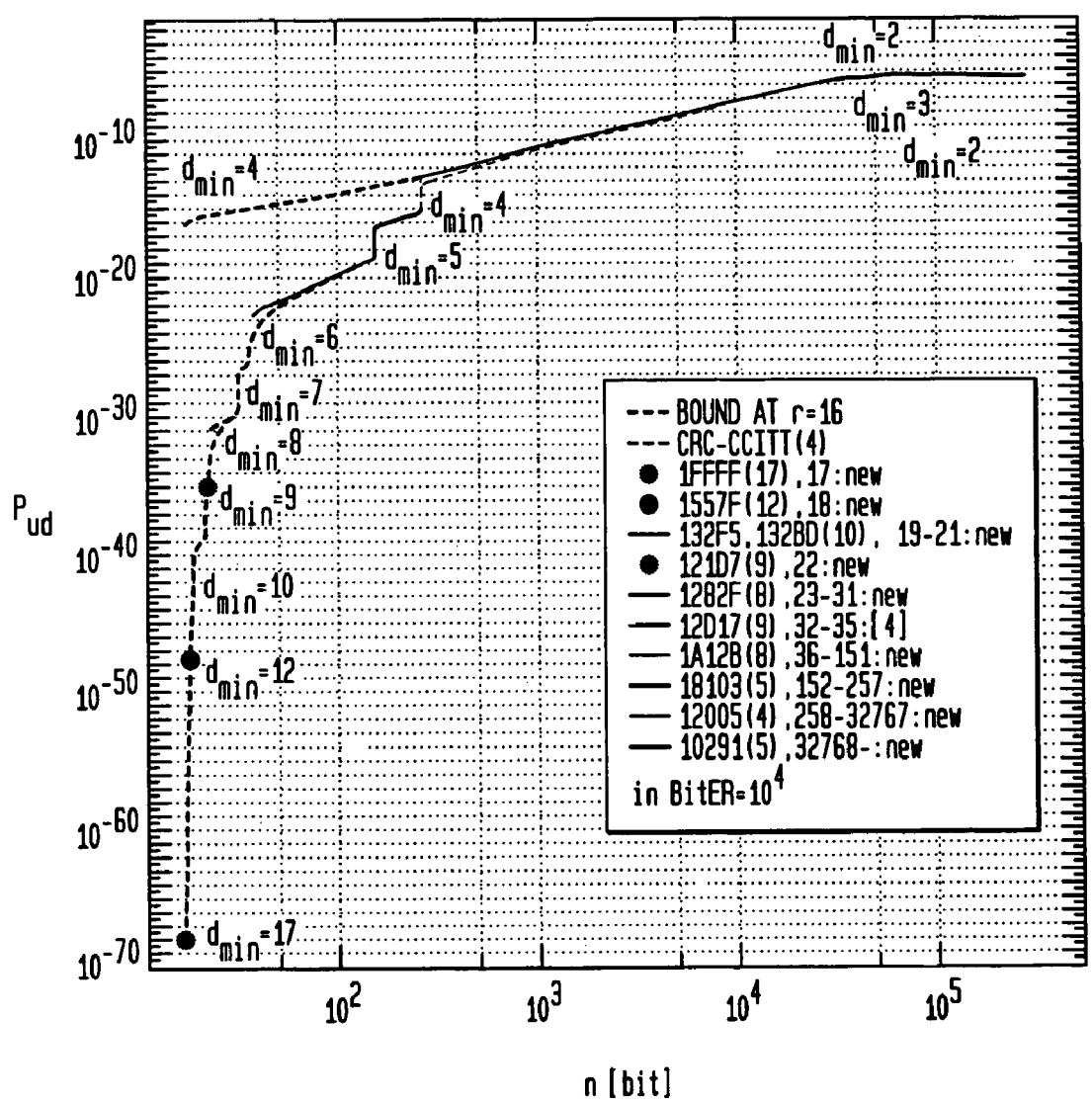
FIG. 10 is a diagram showing graphs each referred to as a n-$P_{ud}$ characteristic representing a relation between the code length n and the code undetected-error probability $P_{ud}$ as graphs of the embodiment and the existing technologies for 16-bit CRC processing.
Figure 11:
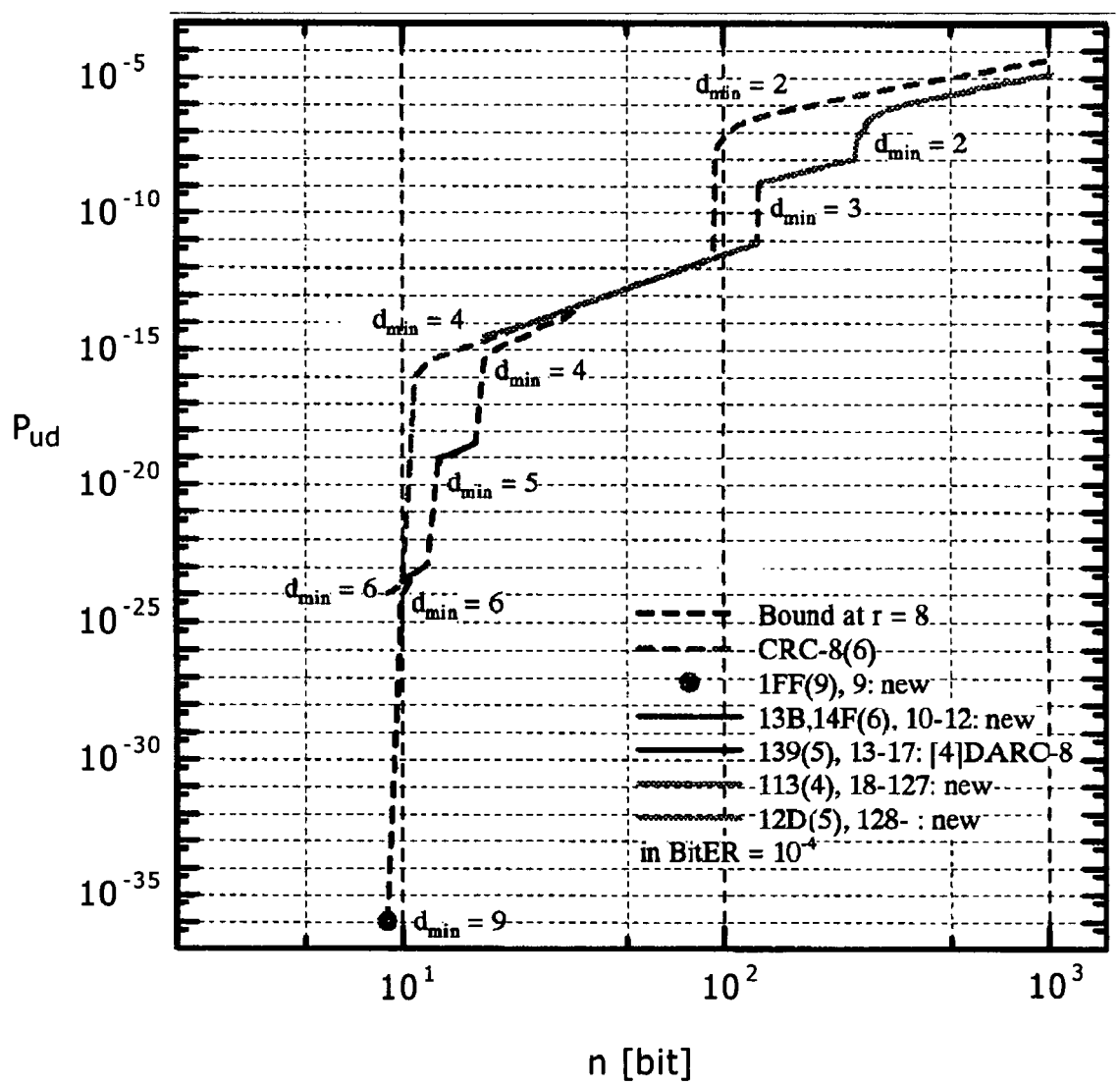
FIG. 11 is a diagram showing graphs each referred to as the n-$P_{ud}$ characteristic representing a relation between the code length n and the code undetected-error probability $P_{ud}$ as graphs of the embodiment and the existing technologies for 8-bit CRC processing.

FIG. 10 is a diagram showing graphs each referred to as the n-$P_{ud}$ characteristic representing a relation between the code length n and the code undetected-error probability $P_{ud}$ as graphs of the embodiment and the existing technologies for 16-bit CRC processing or CRC processing based on a parity-bit count of 16. On the other hand, FIG. 11 is a diagram showing graphs each referred to as the n-$P_{ud}$ characteristic representing a relation between the code length n and the code undetected-error probability $P_{ud}$ as graphs of the embodiment and the existing technologies for 8-bit CRC processing or CRC processing based on a parity-bit count of 8.

In this example, pieces of data starting with that on the left side are the generator polynomial G(x), the term count w representing the number of terms composing the generator polynomial G(x) and a range of n $n_{min} \leq n \leq n_{max}$ representing the range of code lengths n of code words with a fixed largest minimum Hamming distance Max.$d_{min}$. Pieces of data with the word "new" appended at the end thereof and with a number enclosed in parentheses [ ] as the number identifying another document is data proposed in the other document.

The typical generator polynomials obtained as described above are summarized to result in the following generator polynomials G(x):

(1): For the order r=3 and the code length n=4, the following generator polynomial is obtained: $G(x)=x^3+x^2+x+1$.

(2): For the order r=4 and the code length n in a range of 6≦n≦7, the following generator polynomial is obtained: $G(x)=x^4+x^2+x+1$. (In this case, the expression of the reciprocal polynomial of the generator polynomial G(x) is $x^4+x^3+x^2+1$).

(3): For the order r=6 and the code length n=7, the following generator polynomial is obtained: $G(x)=x^6+x^5+x^4+x^3+x^2+x+1$.

(4): For the order r=6 and the code length n=8, the following generator polynomial is obtained: $G(x)=x^6+x^4+x^2+x+1$. (In this case, the expression of the reciprocal polynomial of the generator polynomial G(x) is $X6+x^5+x^4+x^2+1$).

(5): For the order r=6 and the code length n=8, the following generator polynomial is obtained: $G(x)=x^6+x^4+x^3+x+1$. (In this case, the expression of the reciprocal polynomial of the generator polynomial G(x) is $x^6+x^5+x^3+x^2+1$).

(6): For the order r=6 and the code length n=8, the following generator polynomial is obtained: $G(x)=x^6+x^5+x^3+x+1$.

(7): For the order r=6 and the code length n in a range of 9≦n≦31, the following generator polynomial is obtained: $G(x)=x^6+x^2+x+1$. (In this case, the expression of the reciprocal polynomial of the generator polynomial G(x) is $x^6+x^5+x^4+1$).

(8): For the order r=8 and the code length n=9, the following generator polynomial is obtained: $G(x)=x^8+x^7+x^6+x^5+x^4+x^3+x^2+x+1$.

(9): For the order r=8 and the code length n in a range of 10≦n≦12, the following generator polynomial is obtained: $G(x)=x^8+x^5+x^4+x^3+x+1$. (In this case, the expression of the reciprocal polynomial of the generator polynomial G(x) is $x^8+x^7+x^5+x^4+x^3+1$).

(10): For the order r=8 and the code length n in a range of 10≦n≦12, the following generator polynomial is obtained: $G(x)=x^8+x^6+x^3+x^2+x+1$. (In this case, the expression of the reciprocal polynomial of the generator polynomial G(x) is $x^8+x^7+x^6+x^5+x^2+1$).

(11): For the order r=8 and the code length n in a range of 18≦n≦127, the following generator polynomial is obtained: $G(x)=x^8+x^4+x+1$. (In this case, the expression of the reciprocal polynomial of the generator polynomial G(x) is $x^8+x^7+x^4+1$).

(12): For the order r=8 and the code length n in a range of n≧128, the following generator polynomial is obtained: $G(x)=x^8+x^5+x^3+x^2+1$. (In this case, the expression of the reciprocal polynomial of the generator polynomial G(x) is $X8+x^6+x^5+x^3+1$).

(13): For the order r=10 and the code length n=11, the following generator polynomial is obtained: $G(x)=x^{10}+x^9+x^8+x^7+x^6+x^5+x^4+x^3+x^2+x+1$.

(14): For the order r=10 and the code length n=12, the following generator polynomial is obtained: $G(x)=x^{10}+x^8+x^6+x^4+x^3+x^2+x+1$. (In this case, the expression of the reciprocal polynomial of the generator polynomial G(x) is $x^{10}+x^9+x^8+x^7+x^6+x^4+x^2+1$).

(15): For the order r=10 and the code length n in a range of 23≦n≦31, the following generator polynomial is obtained: $G(x)=x^{10}+x^9+x^3+x+1$. (In this case, the expression of the reciprocal polynomial of the generator polynomial G(x) is $x^{10}+x^9+x^7+x+1$).

(16): For the order r=10 and the code length n in a range of 32≦n≦511, the following generator polynomial is obtained: $G(x)=x^{10}+x^5+x^2+1$. (In this case, the expression of the reciprocal polynomial of the generator polynomial G(x) is $x^{10}+x^8+x^5+1$).

(17): For the order r=10 and the code length n in a range of n≧512, the following generator polynomial is obtained: $G(x)=x^{10}+x^3+1$. (In this case, the expression of the reciprocal polynomial of the generator polynomial G(x) is $x^{10}+x^7+1$).

(18): For the order r=12 and the code length n=13, the following generator polynomial is obtained: $G(x)=x^{12}+x^{11}+x^{10}+x^9+x^8+x^7+x^6+x^5+x^4+x^3+x^2+x+1$.

(19): For the order r=12 and the code length n=14, the following generator polynomial is obtained: $G(x)=x^{12}+x^{10}+x^8+x^6+x^4+x^3+x^2+x+1$. (In this case, the expression of the reciprocal polynomial of the generator polynomial G(x) is $x^{12}+x^{11}+x^{10}+x^9+x^8+x^6+x^4+x^2+1$).

(20): For the order r=12 and the code length n in a range of 24≦n≦39, the following generator polynomial is obtained: $G(x)=x^{12}+x^{11}+x^7+x^3+x+1$. (In this case, the expression of the reciprocal polynomial of the generator polynomial G(x) is $x^{12}+x^{11}+x^9+x^5+x+1$)

(21): For the order r=12 and the code length n in a range of 40≦n≦65, the following generator polynomial is obtained: $G(x)=x^{12}+x^{10}+x^7+x^6+x^5+x^2+1$.

(22): For the order r=12 and the code length n in a range of 66≦n≦2,047, the following generator polynomial is obtained: $G(x)=x^{12}+x^7+x^2+1$. (In this case, the expression of the reciprocal polynomial of the generator polynomial G(x) is $x^{12}+x^{10}+x^5+1$).

(23): For the order r=12 and the code length n in a range of n≧2,048, the following generator polynomial is obtained: $G(x)=x^{12}+x^7+x^6+x^4+1$. (In this case, the expression of the reciprocal polynomial of the generator polynomial G(x) is $x^{12}+x^8+x^6+x^5+1$).

(24): For the order r=14 and the code length n=15, the following generator polynomial is obtained: $G(x)=x^{14}+x^{13}+x^{12}+x^{11}+x^{10}+x^9+x^8+x^7+x^6+x^5+x^4+x^3+x^2+x+1$.

(25): For the order r=14 and the code length n=16, the following generator polynomial is obtained: $G(x)=x^{14}+x^{12}+x^{10}+x^9+x^7+x^5+x^4+x^3+x+1$. (In this case, the expression of the reciprocal polynomial of the generator polynomial G(x) is $x^{14}+x^{13}+x^{11}+x^{10}+x^9+x^7+x^5+x^4+x^2+1$).

(26): For the order r=14 and the code length n=17, the following generator polynomial is obtained: $G(x)=x^{14}+x^{11}+x^8+x^6+x^5+x^3+x^2+x+1$. (In this case, the expression of the reciprocal polynomial of the generator polynomial G(x) is $x^{14}+x^{13}+x^{12}+x^{11}+x^9+x^8+x^6+x^3+1$)

(27): For the order r=14 and the code length n in a range of 28≦n≦71, the following generator polynomial is obtained: $G(x)=x^{14}+x^{10}+x^9+x^6+x^2+1$. (In this case, the expression of the reciprocal polynomial of the generator polynomial G(x) is $x^{14}+x^{12}+x^8+x^5+x^4+1$).

(28): For the order r=14 and the code length n in a range of 72≦n≦127, the following generator polynomial is obtained: $G(x)=x^{14}+x^{11}+x^5+x^3+1$. (In this case, the expression of the reciprocal polynomial of the generator polynomial G(x) is $x^{14}+x^{11}+x^9+x^3+1$).

(29): For the order r=14 and the code length n in a range of $128 \leq n \leq 8,191$, the following generator polynomial is obtained: $G(x)=x^{14}+x^5+x^2+1$. (In this case, the expression of the reciprocal polynomial of the generator polynomial G(x) is $x^{14}+x^{12}+x^9+1$).

(30): For the order r=14 and the code length n in a range of $n \geq 8,192$, the following generator polynomial is obtained: $G(x)=x^{14}+x^6+x^4+x+1$. (In this case, the expression of the reciprocal polynomial of the generator polynomial G(x) is $x^{14}+x^{13}+x^{10}+x^8+1$).

(31): For the order r=16 and the code length n=17, the following generator polynomial is obtained: $G(x)=x^{16}+x^{15}+x^{14}+x^{13}+x^{12}+x^{11}+x^{10}+x^9+x^8+x+x^6+x^4+x^3+x^2+x+1$.

(32): For the order r=16 and the code length n=18, the following generator polynomial is obtained: $G(x)=x^{16}+x^{14}+x^{12}+x^{10}+x^8+x^6+x^5++x^4+x^3+x^2+x++1$. (In this case, the expression of the reciprocal polynomial of the generator polynomial G(x) is $x^{16}+x^{15}+x^{14}+x^{13}+x^{12}+x^{11}+x^{10}+x^8+x^6+x^4+x^2+1$).

(33): For the order r=16 and the code length n a range of $19 \leq n \leq 21$, the following generator polynomial obtained: $G(x)=x^{16}+x^{13}+x^{12}+x^9+x^7+x^6+x^5+x^4+x^2+1$. (In this case, the expression of the reciprocal polynomial of the generator polynomial G(x) is $x^{16}+x^{14}+x^{12}+x^{11}+x^{10}+x^9+x^7+x^4+x^3+1$).

(34): For the order r=16 and the code length n a range of $19 \leq n \leq 21$, the following generator polynomial is obtained: $G(x)=x^{16}+x^{13}+x^{12}+x^9+x^7+x^5+x^4+x^3+x^2+1$. (In this case, the expression of the reciprocal polynomial of the generator polynomial G(x) is $x^{16}+x^{14}+x^{13}+x^{12}+x^{11}+x^9+x^7+x^4+x^3+1$).

(35): For the order r=16 and the code length n=22, the following generator polynomial is obtained: $G(x)=x^{16}+x^{13}+x^8+x^7+x^6+x^4+x^2+x+1$. (In this case, the expression of the reciprocal polynomial of the generator polynomial G(x) is $x^{16}+x^{15}+x^{14}+x^{12}+x^{10}+x^9+x^8+x^3+1$).

(36): For the order r=16 and the code length n in a range of $23 \leq n \leq 31$, the following generator polynomial is obtained: $G(x)=x^{16}+x^{13}+x^{11}+x^5+x^3+x^2+x+1$. (In this case, the expression of the reciprocal polynomial of the generator polynomial G(x) is $x^{16}+x^{15}+x^{14}+x^{13}+x^{11}+x^5+x^3+1$).

(37): For the order r=16 and the code length n in a range of $36 \leq n \leq 151$, the following generator polynomial is obtained: $G(x)=x^{16}+x^{15}+x^{13}+x^8+x^5+x^3+x+1$. (In this case, the expression of the reciprocal polynomial of the generator polynomial G(x) is $x^{16}+x^{15}+x^{13}+x^{11}+x^8+x^3+x+1$).

(38): For the order r=16 and the code length n in a range of $152 \leq n \leq 257$, the following generator polynomial is obtained: $G(x)=x^{16}+x^{15}+x^8+x+1$.

(39): For the order r=16 and the code length n in a range of $258 \leq n \leq 32,767$, the following generator polynomial is obtained: $G(x)=x^{16}+x^{13}+x^2+1$. (In this case, the expression of the reciprocal polynomial of the generator polynomial G(x) is $x^{16}+x^{14}+x^3+1$).

(40): For the order r=16 and the code length n in a range of $n \geq 32,768$, the following generator polynomial is obtained: $G(x)=x^{16}+x^9+x^7+x^4+1$. (In this case, the expression of the reciprocal polynomial of the generator polynomial G(x) is $x^{16}+x^{12}+x^9+x^7+1$).

As described above, in accordance with the embodiment of the present invention, a variety of generator polynomials G(x) satisfying a variety of conditions can be found. It is to be noted that the generator polynomials G(x) can also classified into two categories. For the generator polynomials G(x) in one of the categories, the equation $n_{min}=n_{max}$ holds true. In the equation, notation $n_{min}$ denotes the lower limit of the range of code lengths n whereas $n_{max}$ denotes the upper limit of a range of code lengths n. For the generator polynomials G(x) in the other category, the relation $n_{min} \neq n_{max}$ holds true.

CRC Coding Methods and CRC Coding Circuits

Figure 1:
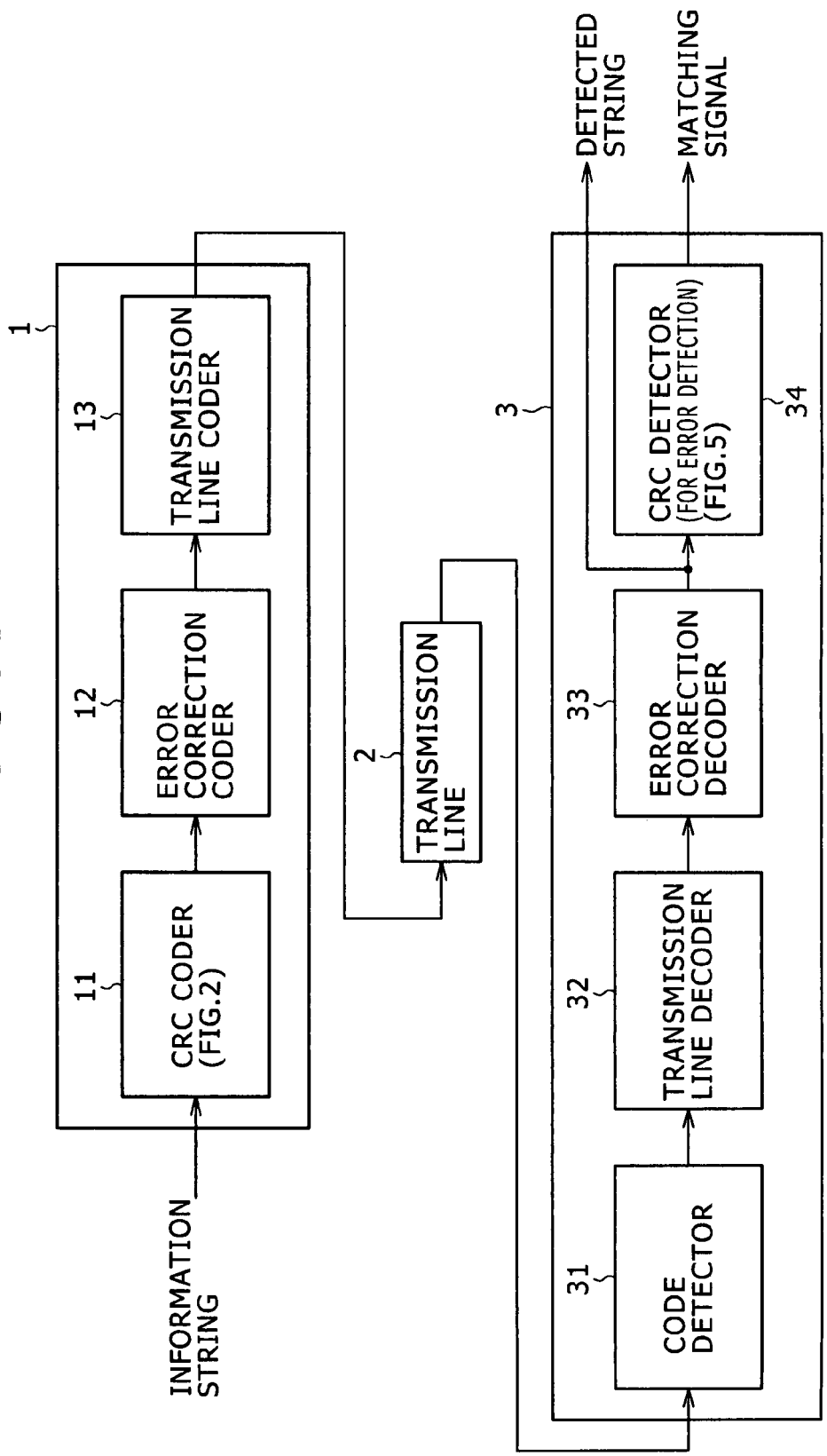
FIG. 1 is a diagram showing typical configurations of an information-transmitting apparatus and an information-receiving apparatus according to an embodiment applying a CRC coding method and a CRC coding apparatus, which are provided by the present invention.
Figure 2:
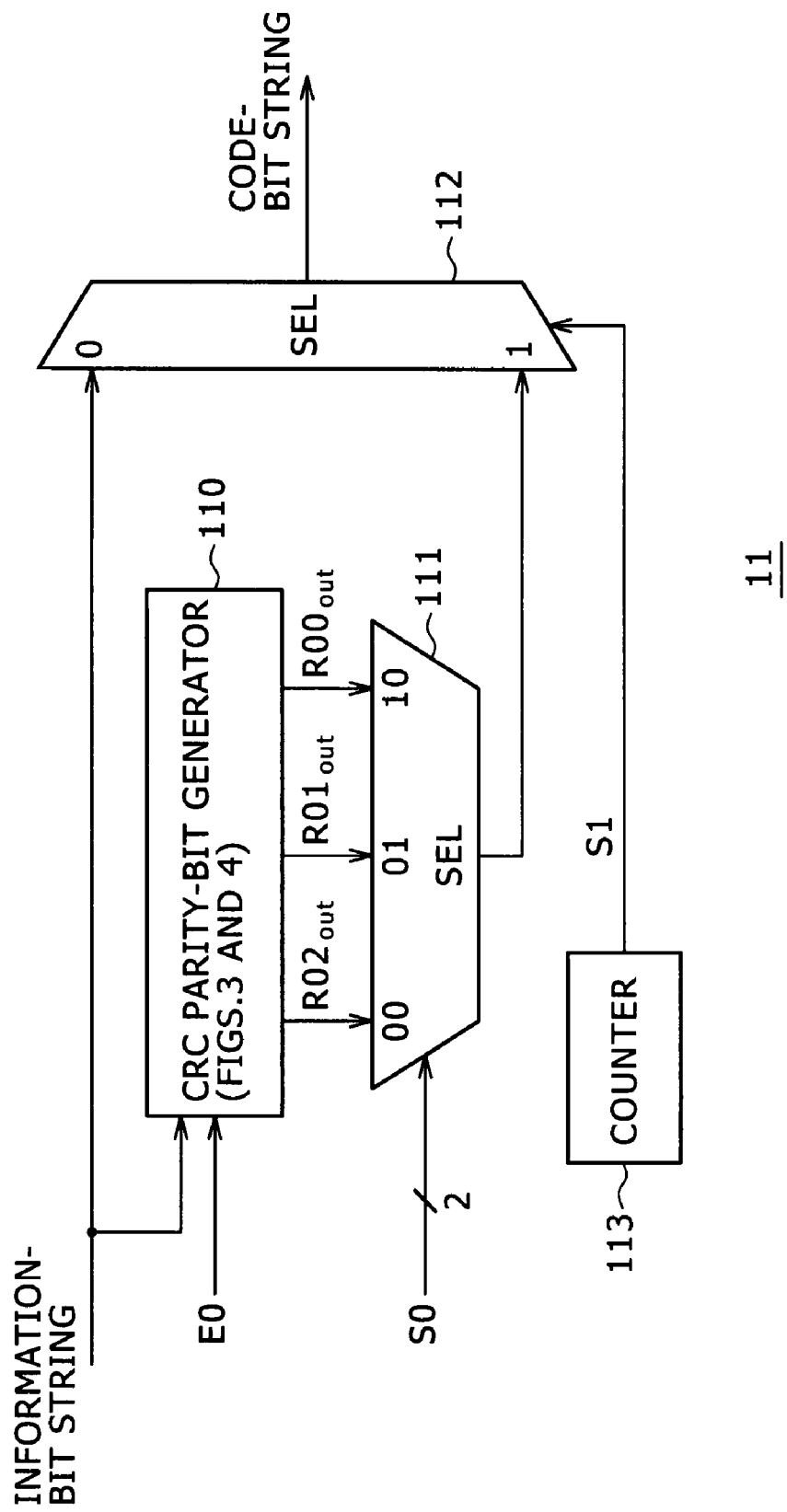
FIG. 2 is a diagram showing a typical configuration of a CRC coder employed in the information-transmitting apparatus shown in FIG. 1.
Figure 3:
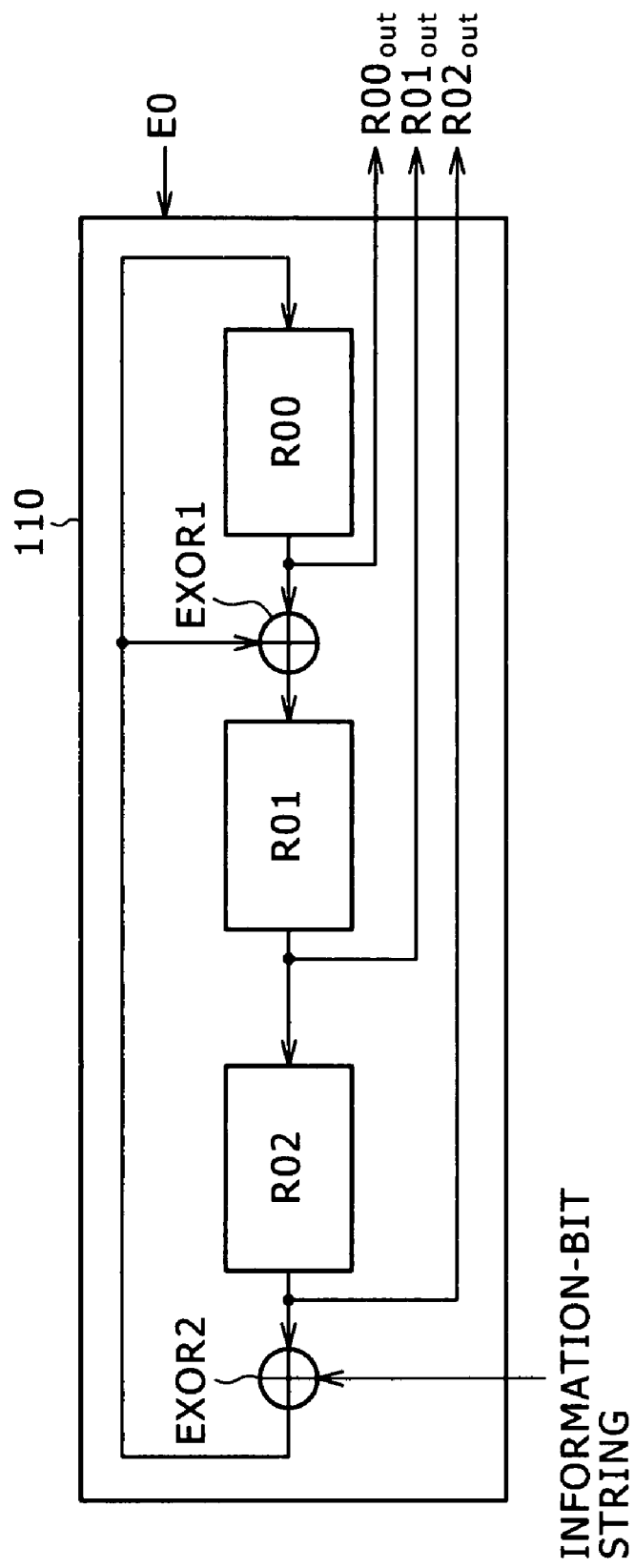
FIG. 3 is a diagram showing a first typical configuration of a CRC parity generator employed in the CRC coder shown in FIG. 2.
Figure 4:
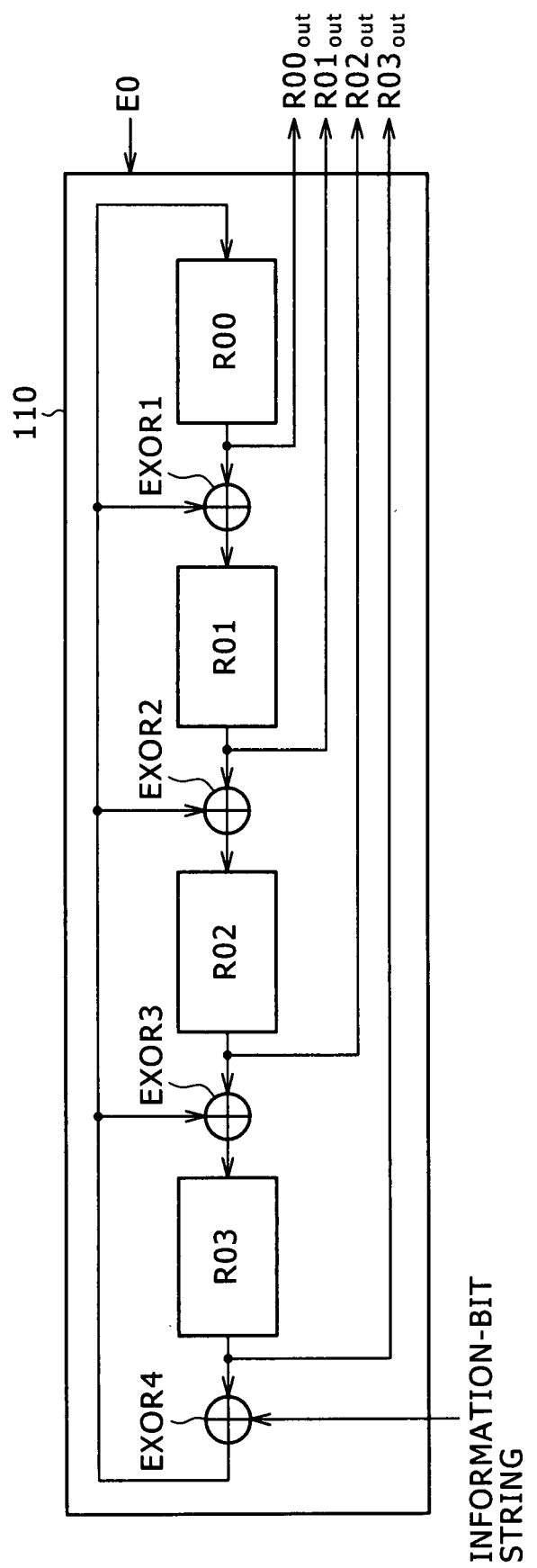
FIG. 4 is a diagram showing a second typical configuration of the CRC parity generator employed in the CRC coder shown in FIG. 2.
Figure 5:
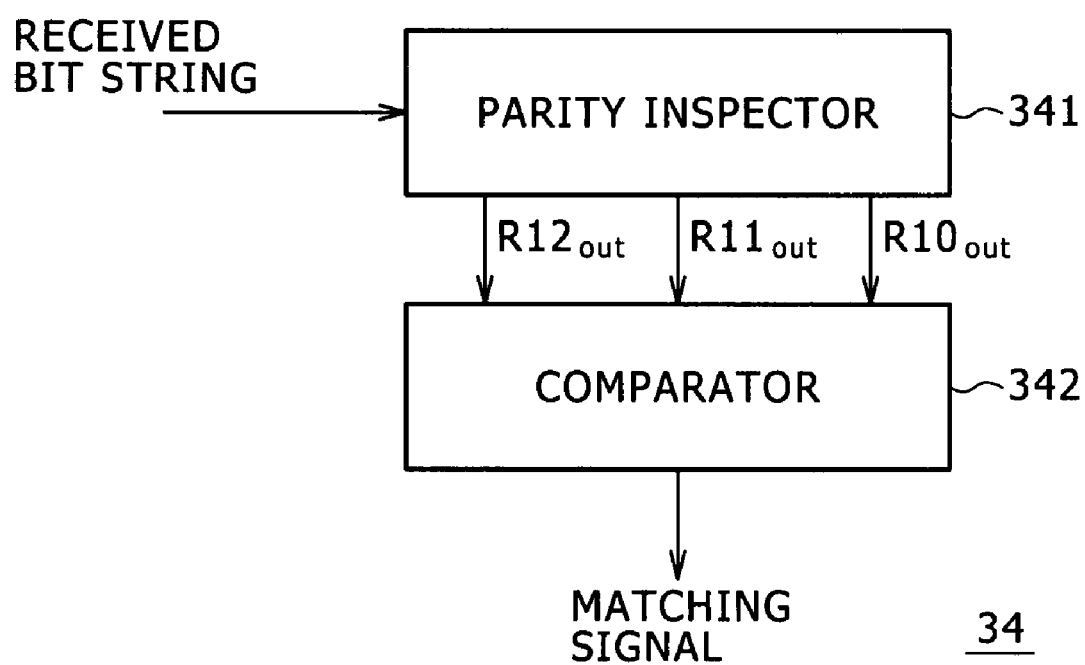
FIG. 5 is a diagram showing a typical configuration of a CRC detector employed in the information-receiving apparatus shown in FIG. 1.
Figure 6:
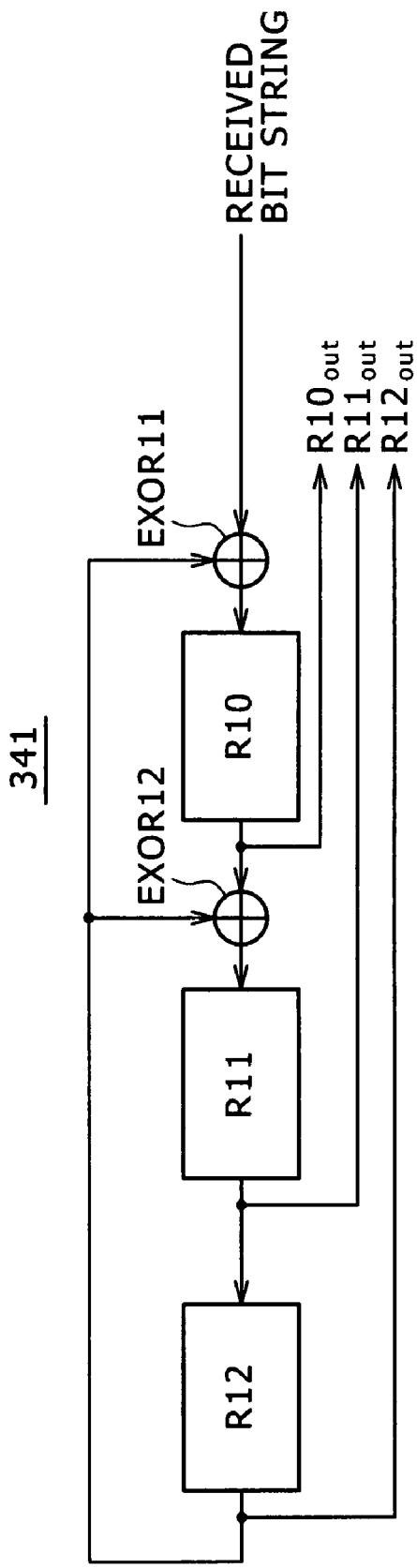
FIG. 6 is a diagram showing a typical configuration of a CRC parity inspector employed in the CRC detector shown in FIG. 5.

Any of the generator polynomials G(x) found as described above can be applied for example to the CRC parity bit generator 110 shown in FIG. 2 and the parity inspector 341 shown in FIG. 5. When a generator polynomial G(x) is applied to the CRC parity bit generator 110 shown in FIG. 2, for example, as shown in the circuit configuration of FIG. 3 or 4, shift registers and exclusive-or gates are connected to each other in accordance with the order r of the generator polynomial G(x) to form a closed loop. To be more specific, in the circuit configuration, the exclusive-or gates are provided in accordance with coefficients of the generator polynomial G(x) and the output of the exclusive-or gate provided at the last stage is supplied to one input of each other exclusive-or gate provided at a preceding stage. In the case of the circuit configuration shown in FIG. 3, for example, the exclusive-or gate provided at the last stage is the second exclusive-or gate EXOR2. In this way, on the basis of a generator polynomial G(x) found as described above, a CRC coding circuit can be built with ease by connecting shift registers and exclusive-or gates to each other.

The parity inspector 341 can also be configured in the same way as the CRC parity bit generator 110.

As is understood from Tables 1-A to 1-C as well as FIGS. 10 and 11, each of the widely used generator polynomials compared with the generator polynomials according to the embodiment of the present invention exhibits a characteristic of the undetected-error probability $P_{ud}$ approaching a bound in the range of the code lengths n. Outside the range of the code lengths n, on the other hand, the characteristics of the minimum Hamming distance $d_{min}$ between codes and the code undetected-error probability $P_{ud}$ deteriorate much in comparison with the bound. When compared with the widely used generator polynomials, each of the generator polynomials according to the embodiment of the present invention exhibits a characteristic of the undetected-error probability $P_{ud}$ approaching the bound for all code lengths n.

As described above, by adopting the CRC coding method based on a generator polynomial found in accordance with the preferred embodiment of the present invention, in comparison with the existing method based on the generator polynomials widely used in the past, for a desired number of parity bits and a desired code length, the code undetected-error probability can be suppressed to a small value. In addition, by maximizing the minimum Hamming distance between codes, the random-error detection performance can be improved.

For code lengths n in a range of $n_{min}(r, \text{Max}.d_{min}) \leq n \leq n_{max}(r, \text{Max}.d_{min})$, codes provided by the generator polynomial G(x) satisfy the conditions of $d_{min}=\text{Max}.d_{min}$ and $P_{ud} \approx$ Bound. Thus, even if the code length n varies, one generator polynomial G(x) can be used for keeping up with changes in code length n as long as the code length n stays in the range.

In addition, for code lengths n in a range of $n_{min}(r, \text{Max}.d_{min}) \leq n \leq n_{max}(r, \text{Max}.d_{min})$, a generator polynomial G(x) with the smallest term count w is typically selected among generator polynomials G(x) each used as a base for generating a code word for which the code minimum Hamming distance $d_{min}$ has a maximum value. Thus, the CRC circuit can be implemented at a small scale.

On top of that, the order r also representing the number of parity bits can be found from a given code length n and a given code undetected-error probability $P_{ud}$ as an order r requisite to satisfy the code length n and the code undetected-error probability $P_{ud}$. Thus, by using a generator polynomial G(x) selected for the parity-bit count r and the code length n, a desired code undetected-error probability $P_{ud}$ can be obtained.

It should be understood by those skilled in the art that various modifications, combinations, sub-combinations and alterations may occur depending on design requirements and other factor in so far as they are within the scope of the appended claims or the equivalents thereof.

The invention claimed is:

1. A CRC generator polynomial select method for selecting a generator polynomial to be used by a CRC coding circuit and/or a CRC detecting circuit, said CRC generator polynomial select method comprising:
   a first process of finding largest minimum Hamming distances Max.$d_{min}$ of codes generated by various polynomials;
   a second process of finding code lengths n for each of said largest minimum Hamming distances Max.$d_{min}$ and determining a range $n_{min}$ (r, Max.$d_{min}$) $\leq n \leq n_{max}$ (r, Max.$d_{min}$) as the range of said code lengths, where r is a polynomial order;
   a third process of searching all corresponding generator polynomials for specific generator polynomials satisfying a condition of that said minimum Hamming distance $d_{min}$ between codes generated thereby be typically equal to said largest minimum Hamming distance Max.$d_{min}$, in said range;
   a fourth process of selecting final generator polynomials having a smallest term count w and a lowest code undetected-error probability from said specific generator polynomials; and
   applying a selected final generator polynomial G(x) to the CRC coding circuit and/or the CRC detecting circuit for use thereat.

2. The CRC generator polynomial select method according to claim 1, wherein the CRC coding circuit has a configuration based on the selected generator polynomial including shift registers and exclusive-or gates provided in accordance with coefficients of said selected generator polynomial and connected to said shift registers to form a closed loop in which the output of one of said exclusive-or gates which is provided at the last stage is supplied to said other exclusive-or gates.

3. The CRC generator polynomial select method according to claim 1 wherein said third and fourth processes comprise:
   a process of searching all generator polynomials for specific generator polynomials satisfying a condition of $p \geq n_{max}$ (r, Max.$d_{min}$) requiring that the period p of said specific generator polynomials be at least equal to said upper limit $n_{max}$ Max.$d_{min}$) and satisfying a condition that said minimum)Hamming distance $d_{min}$ between codes be typically equal to said largest minimum Hamming distance Max.$d_{min}$, for code lengths n in the range $(n_{max}-r)$ to $n_{max}$;
   a process of selecting particular generator polynomials having a smallest term count from said specific generator polynomials; and
   a process of selecting final generator polynomials having a lowest code undetected-error probability from said particular polynomials.

4. The CRC generator polynomial select method according to claim 3 whereby, in said processes of searching and selecting generator polynomials G(x), for Max.$d_{min}$ = 2, final generator polynomials having a smallest term count and a lowest code undetected-error probability are selected from primitive generator polynomials.

5. The CRC generator polynomial select method according to any one of claims 1 to 4 wherein a condition of $n_{min} \neq n_{max}$ holds true.

6. The CRC generator polynomial select method according to any one of claims 1 to 4 whereby any of the following generator polynomials G(x) are selected:
   (1): for r=3 and n=4, a generator polynomial expressed by $G(x)=x^3+x^2+x+1$;
   (2): for r=6 and n=7, a generator polynomial expressed by $G(x)=x^6+x^5+x^4+x^3+x^2+x+1$;
   (3): for r=6 and n=8, a generator polynomial expressed by $G(x)=x^6+x^4+x^2+x+1$ (or a generator polynomial, the expression of the reciprocal polynomial of which is $x^6+x^5+x^4+x^2+1$);
   (4): for r=6 and n=8, a generator polynomial expressed by $G(x)=x6+x^4+x^3+x+1$ (or a generator polynomial, the expression of the reciprocal polynomial of which is $x^6+x^5+x^3+x^2+1$);
   (5): for r=6 and n=8, a generator polynomial expressed by $G(x)=x^6+x^5+x^3+x+1$;
   (6): for r=8 and n=9, a generator polynomial expressed by $G(x)=x^8+x^7+x^6+x^5+x^4+x^3+x^2+x+1$;
   (7): for r=10 and n=11, a generator polynomial expressed by $G(x)=x^{10}+x^9+x^8+x^7+x^6+x^5+x^4+x^3+x^2+x+1$;
   (8): for r=10 and n=12, a generator polynomial expressed by $G(x)=x^{10}+x^8+x^6+x^4+x^3+x^2+x+1$ (or a generator polynomial, the expression of the reciprocal polynomial of which is $x^{10}+x^9+x^8+x^7+x^6+x^4+x^2+1$);
   (9): for r=12 and n=13, a generator polynomial expressed by $G(x)=x^{12}+x^{11}+x^{10}+x^9+x^8+x^7+x^6+x^5+x^4+x^3+x^2+x+1$;
   (10): for r=12 and n=14, a generator polynomial expressed by $G(x)=x^{12}+x^{10}+x^8+x^6+x^4+x^3+x^2+x+1$ (or a generator polynomial, the expression of the reciprocal polynomial of which is $x^{12}+x^{11}+x^{10}+x^9+x^8+x^6+x^4+x^2+1$);
   (11): for r=14 and n=15, a generator polynomial expressed by $G(x)=x^{14}+x^{13}+x^{12}+x^{11}+x^{10}+x^9+x^8+x^7+x^6+x^5+x^4+x^3+x^2+x+1$;
   (12): for r=14 and n=16, a generator polynomial expressed by $G(x)=x^{14}+x^{12}+x^{10}+x^9+x^7+x^5+x^4+x^3+x+1$ (or a generator polynomial, the expression of the reciprocal polynomial of which is $x^{14}+x^{13}+x^{11}+x^{10}+x^9+x^7+x^5+x^4+x^2+1$);
   (13): for r=14 and n=17, a generator polynomial expressed by $G(x)=x^{14}+x^{11}+x^8+x^6+x^5+x^3+x^2+x+1$ (or a generator polynomial, the expression of the reciprocal polynomial of which is $x^{14}+x^{13}+x^{12}+x^{11}+x^9+x^8+x^6+x^3+1$);
   (14): for r=16 and n=17, a generator polynomial expressed by $G(x)=x^{16}+x^{15}+x^{14}+x^{13}+x^{12}+x^{11}+x^{10}+x^9+x^8+x^7+x^6+x^5+x^4+x^3+x^2+x+1$;
   (15): for r=16 and n=18, a generator polynomial expressed by $G(x)=x^{16}+x^{14}+x^{12}+x^{10}+x^8+x^6+x^5+x^4+x^3+x^2+x+1$ (or a generator polynomial, the expression of the reciprocal polynomial of which is $x^{16}+x^{15}+x^{14}+x^{13}+x^{12}+x^{11}+x^{10}+x^8+x^6+x^4+x^2+1$); and
   (16): for r=16 and n=22, a generator polynomial expressed by $G(x)=x^{16}+x^{13}+x^8+x^7+x^6+x^4+x^2+x+1$ (or a generator polynomial, the expression of the reciprocal polynomial of which is $x^{16}+x^{15}+x^{14}+x^{12}+x^{10}+x^9+x^8+x^3+1$).

7. The CRC generator polynomial select method according to claim 5 whereby any of the following generator polynomials G(x) are selected:
   (1): for r=4 and n in a range of $6 \leq n \leq 7$, a generator polynomial expressed by $G(x)=x^4+x^2+x+1$ (or a generator polynomial, the expression of the reciprocal polynomial of which is $x^4+x^3+x^2+1$);
   (2): for r=6 and n in a range of $9 \leq n \leq 31$, a generator polynomial expressed by $G(x)=x^6+x^2+x+1$ (or a generator polynomial, the expression of the reciprocal polynomial of which is $x^6+x^5+x^4+1$);

(3): for r=8 and n in a range of 10≦n≦12, a generator polynomial expressed by $G(x)=x^8+x^5+x^4+x^3+x+1$ (or a generator polynomial, the expression of the reciprocal polynomial of which is $x^8+x^7+x^5+x^4+x^3+1$);

(4): for r=8 and n in a range of 10≦n≦12, a generator polynomial expressed by $G(x)=x^8+x^6+x^3+x^2+x+1$ (or a generator polynomial, the expression of the reciprocal polynomial of which is $x^8+x^7+x^6+x^5+x^2+1$);

(5): for r=8 and n in a range of 18≦n≦127, a generator polynomial expressed by $G(x)=x^8+x^4+x+1$ (or a generator polynomial, the expression of the reciprocal polynomial of which is $x^8+x^7+x^4+1$);

(6): for r=8 and n in a range of n≧128, a generator polynomial expressed by $G(x)=x^8+x^5+x^3+x^2+1$ (or a generator polynomial, the expression of the reciprocal polynomial of which is $x^8+x^6+x^5+x^3+1$);

(7): for r=10 and n in a range of 23≦n≦31, a generator polynomial expressed by $G(x)=x^{10}x^9+x^3+x+1$ (or a generator polynomial, the expression of the reciprocal polynomial of which is $x^{10}+x^9+x^7+x+1$);

(8): for r=10 and n in a range of 32≦n≦511, a generator polynomial expressed by $G(x)=x^{10}+x^5+x^2+1$ (or a generator polynomial, the expression of the reciprocal polynomial of which is $x^{10}+x^8+x^5+1$);

(9): for r=10 and n in a range of n≧512, a generator polynomial expressed by $G(x)=x^{10}+x^3+1$ (or a generator polynomial, the expression of the reciprocal polynomial of which is $x^{10}+x^7+1$);

(10): for r=12 and n in a range of 24≦n≦39, a generator polynomial expressed by $G(x)=x^{12}x^{11}+x^7+x^3+x+1$ (or a generator polynomial, the expression of the reciprocal polynomial of which is $x^{12}+x^{11}+x^9+x^5+x+1$);

(11): for r=12 and n in a range of 40≦n≦65, a generator polynomial expressed by $G(x)=x^{12}+x^{10}+x^7+x^6+x^5+x^2+1$;

(12): for r=12 and n in a range of 66≦n≦2,047, a generator polynomial expressed by $G(x)=x^{12}+x^7+x^2+1$ (or a generator polynomial, the expression of the reciprocal polynomial of which is $x^{12}+x^{10}+x^5+1$);

(13): for r=12 and n in a range of n≧2,048, a generator polynomial expressed by $G(x)=x^{12}+x^7+x^6+x^4+1$ (or a generator polynomial, the expression of the reciprocal polynomial of which is $x^{12}+x^8+x^6+x^5+1$);

(14): for r=14 and n in a range of 28≦n≦71, a generator polynomial expressed by $G(x)=x^{14}+x^{10}+x^9+x^6+x^2+1$ (or a generator polynomial, the expression of the reciprocal polynomial of which is $x^{14}+x^{12}+x^8+x^5+x^4+1$);

(15): for r=14 and n in a range of 72≦n≦127, a generator polynomial expressed by $G(x)=x^{14}+x^{11}+x^5+x^3+1$ (or a generator polynomial, the expression of the reciprocal polynomial of which is $x^{14}+x^{11}+x^9+x^3+1$);

(16): for r=14 and n in a range of 128≦n≦8,191, a generator polynomial expressed by $G(x)=x^{14}+x^5+x^2+1$ (or a generator polynomial, the expression of the reciprocal polynomial of which is $x^{14}+x^{12}+x^9+1$);

(17): for r=14 and n in a range of n≧8,192, a generator polynomial expressed by $G(x)=x^{14}+x^6+x^4+x+1$ (or a generator polynomial, the expression of the reciprocal polynomial of which is $x^{14}+x^{13}+x^{10}+x^8+1$);

(18): for r=16 and n in a range of 19≦n≦21, a generator polynomial expressed by $G(x)=x^{16}+x^{13}+x^{12}+x^9+x^7+x^5+x^4+x^2+1$ (or a generator polynomial, the expression of the reciprocal polynomial of which is $x^{16}+x^{14}+x^{12}+x^{11}+x^{10}+x^9+x^7+x^4+x^3+1$);

(19): for r=16 and n in a range of 19≦n≦21, a generator polynomial expressed by $G(x)=x^{16}+x^{13}+x^{12}+x^9+x^7+x^5+x^4+x^3+x^2+1$ (or a generator polynomial, the expression of the reciprocal polynomial of which is $x^{16}+x^{14}+x^{13}+x^{12}+x^{11}+x^9+x^7+x^4+x^3+1$);

(20): for r=16 and n in a range of 23≦n≦31, a generator polynomial expressed by $G(x)=x^{16}+x^{13}+x^{11}+x^5+x^3+x^2+x+1$ (or a generator polynomial, the expression of the reciprocal polynomial of which is $x^{16}+x^{15}+x^{14}+x^{13}+x^{11}+x^5+x^3+1$);

(21): for r=16 and n in a range of 36≦n≦151, a generator polynomial expressed by $G(x)=x^{16}+x^{15}+x^{13}+x^8+x^5+x^3+x+1$ (or a generator polynomial, the expression of the reciprocal polynomial of which is $x^{16}+x^{15}+x^{13}+x^{11}+x^8+x^3+x+1$);

(22): for r=16 and n in a range of 152≦n≦257, a generator polynomial expressed by $G(x)=x^{16}+x^{15}+x^8+x+1$;

(23): for r=16 and n in a range of 258≦n≦32,767, a generator polynomial expressed by $G(x)=x^{16}+x^{13}+x^2+1$ (or a generator polynomial, the expression of the reciprocal polynomial of which is $x^{16}+x^{14}+x^3+1$); and (24): for r=16 and n in a range of n≧32,768, a generator polynomial expressed by $G(x)=x^{16}+x^9+x^7+x^4+1$ (or a generator polynomial, the expression of the reciprocal polynomial of which is $x^{16}+x^{12}+x^9+x^7+1$).

8. A CRC coding method for carrying out a coding process by a CRC coding circuit, on the basis of a generator polynomial G(x) having an order r and a period p, in order to generate a CRC code with a code length n, wherein among a plurality of polynomials with order r generating codes having largest minimum Hamming distances Max.$d_{min}$ in a range of code lengths $n_{min}$≦n≦$n_{max}$, under the condition of period p≧$n_{max}$, or p=$2^r-1$ said generator polynomial G(x) is selected for having a smallest term count and a smallest code undetected-error probability in a binary symmetric channel.

* * * * *